US012245406B2

(12) United States Patent
Levee et al.

(10) Patent No.: US 12,245,406 B2
(45) Date of Patent: Mar. 4, 2025

(54) TANK FOR HEAT DISSIPATION AND A COOLING SYSTEM INCLUDING THE SAME

(71) Applicant: FIRMUS METAL TECHNOLOGIES SINGAPORE PTE LTD, Singapore (SG)

(72) Inventors: Jonathan Levee, Tasmania (AU); Oliver Curtis, Tasmania (AU); Andrew Buls, Tasmania (AU); Hamish Kerr, Tasmania (AU)

(73) Assignee: FIRMUS METAL TECHNOLOGIES SINGAPORE PTE LTD, Singapore (SG)

( * ) Notice: Subject to any disclaimer, the term of this patent is extended or adjusted under 35 U.S.C. 154(b) by 0 days.

(21) Appl. No.: 18/559,205

(22) PCT Filed: Oct. 19, 2021

(86) PCT No.: PCT/AU2021/051215
§ 371 (c)(1),
(2) Date: Nov. 6, 2023

(87) PCT Pub. No.: WO2022/232863
PCT Pub. Date: Nov. 10, 2022

(65) Prior Publication Data
US 2024/0224475 A1   Jul. 4, 2024

(30) Foreign Application Priority Data
May 7, 2021   (AU) .................... 2021901373

(51) Int. Cl.
*H05K 7/20* (2006.01)
(52) U.S. Cl.
CPC ..... *H05K 7/20781* (2013.01); *H05K 7/20236* (2013.01); *H05K 7/20263* (2013.01); *H05K 7/20272* (2013.01); *H05K 7/20309* (2013.01)

(58) Field of Classification Search
CPC ........... H05K 7/20272; H05K 7/20309; H05K 7/20781; H05K 7/2079; H05K 7/20236; H05K 7/20263; H05K 7/20281; F28F 9/22
See application file for complete search history.

(56) References Cited

U.S. PATENT DOCUMENTS

| 9,351,429 B2 | 5/2016 | Shelnutt et al. |
| 2011/0132579 A1* | 6/2011 | Best .................. H05K 7/20836 165/104.31 |

(Continued)

FOREIGN PATENT DOCUMENTS

| CN | 107360705 A | 11/2017 |
| CN | 109588018 A | 4/2019 |

(Continued)

OTHER PUBLICATIONS

International Search Report and Written Opinion in Application No. PCT/AU2021/051215, mailed Nov. 30, 2021, 18 pages.

(Continued)

*Primary Examiner* — Frantz F Jules
*Assistant Examiner* — Martha Tadesse
(74) *Attorney, Agent, or Firm* — Meunier Carlin & Curfman LLC

(57) ABSTRACT

A cooling system (100), comprising: multiple cooling tanks (101), each of the cooling tanks (101) being configured to accommodate a liquid coolant; a set of connection pipes (106) configured to fluidly connect the multiple cooling tanks (101); a set of inlet pipes (102) fluidly connected to the multiple cooling tanks (101) to supply the liquid coolant into the multiple cooling tanks (101); a set of outlet pipes (103) fluidly connected to the multiple cooling tanks (101) to release the liquid coolant carrying the heat absorbed from the computing devices (520) out of the multiple cooling tanks (101); a heat exchanger (104) that fluidly connects to (Continued)

each of the set of inlet pipes (102) and each of the set of outlet pipes (103); and a coolant pump (105) that fluidly connects to each of the set of outlet pipes (103).

34 Claims, 17 Drawing Sheets

(56) References Cited

U.S. PATENT DOCUMENTS

| | | | | |
|---|---|---|---|---|
| 2014/0209272 | A1* | 7/2014 | Stocker | H05K 7/1497 165/59 |
| 2014/0218859 | A1* | 8/2014 | Shelnutt | H05K 7/20809 361/679.46 |
| 2017/0265328 | A1* | 9/2017 | Sasaki | H05K 7/20781 |
| 2017/0303443 | A1* | 10/2017 | Inano | G06F 1/206 |
| 2018/0084676 | A1 | 3/2018 | Edwards et al. | |
| 2020/0323108 | A1* | 10/2020 | Bilan | H05K 7/20781 |

FOREIGN PATENT DOCUMENTS

| | | |
|---|---|---|
| CN | 212034610 U | 11/2020 |
| RU | 2559825 C2 | 8/2015 |
| WO | 2010019517 A1 | 2/2010 |

OTHER PUBLICATIONS

International Preliminary Report on Patentability in Application No. PCT/AU2021/051215, mailed Mar. 30, 2023, 4 pages.

Immersion Cooling, https://web.archive.org/web/20201124223629/ https://www.3m.com/3M/en_US/data-center-us/applications/immersion-cooling/, published on Nov. 24, 2020 as per Wayback Machine.

Dhruv Varma—Data Center Cold Wars—Part 3: Single-Phase Immersion Cooling Versus Cold Plate, https://www.grcooling.com/blog/data-center-cold-wars-part-3-single-phase-immersion-cooling-versus-cold-plate/, published on Feb. 4, 2020.

Examination Report No. 1 for Australian Patent Application No. 2021444494 dated Oct. 10, 2023.

Notice of grant for patent for Australian Patent Application No. 2021444494 dated Mar. 28, 2024.

Notice of acceptance for Australian Patent Application No. 2021444494 dated Dec. 1, 2023.

Claims as accepted in Australian Patent Application No. 2021444494 dated Aug. 23, 2023.

Transcript and screenshot of YouTube video entitled "ICEraQ™ Micro-Modular Rack-Based Immersion Cooling System Overview," 3 pages, posted Jun. 22, 2018 by user "GRC-Green Revolution Cooling." Retrieved from internet: <https://www.youtube.com/watch?v=LHSVnsltwD0>.

Transcript of YouTube video entitled "Immersion-2 Rack Platform (PUE 1.01)," 2 pages, posted Jan. 23, 2014 by user "AlliedControl1." Retrieved from internet: <https://www.youtube.com/watch?v=oZavKweMrP4>.

Examination Report No. 2 issued in Australian Application No. 2024201689, mailed Dec. 17, 2024, 5 pages.

* cited by examiner

Front view

Left side view

507

(a)

(b)

TANK FOR HEAT DISSIPATION AND A COOLING SYSTEM INCLUDING THE SAME

FIELD OF THE INVENTION

The present disclosure relates to heat dissipation, particularly, to a tank for heat dissipation and a cooling system including the same.

BACKGROUND OF THE INVENTION

A data centre usually hosts hundreds, thousands, or tens of thousands of computing devices or servers to perform computing tasks. These computing devices generate a huge amount of heat during operation. The heat generated from the computing devices must be dissipated for the computing devices to operate properly. Otherwise, the computing devices may be damaged due to the accumulated heat in the data centre. Therefore, a cooling system is required to be installed in the data centre to dissipate the heat. Both the computing devices and the cooling system in the data centre consume electricity. Power Usage Effectiveness (PUE) is used to measure the effectiveness of power usage, which is defined as a ratio of total power consumed by a data centre to the power delivered to the computing devices or severs performing the computing tasks. For example, a data centre consumes a total power of 10,000 KW, which is used to power the servers and other equipment, primarily, the cooling system to cool the servers. At the same time, 8,000 KW out of the total power is used to power the servers. Therefore, the PUE of the data centre is 10,000 KW/8,000 KW=1.25. Usually, a lower PUE means less wastage of electricity, lower operating costs, and more competitive advantages.

Air cooling and immersion cooling are currently adopted in data centres. Immersion cooling is advantageous over air cooling in that data centres with immersion cooling have a much lower PUE than those with air cooling. For example, the immersion cooling systems developed by Green Revolution Cooling, Inc. and Alibaba Group have achieved a PUE of 1.05 and 1.07, respectively, compared with the average PUE of 1.59 in 2020. Further, immersion cooling systems require less land footprint for the same capacity, which means more power density. However, with demanding requirements proposed for operation of data centres, for example, a lower PUE, less land footprint or a higher power density, there is a need for an improved cooling system to meet at least some of the requirements.

Any discussion of the background art throughout the specification should in no way be considered as an admission that such background art is prior art, nor that such background art is widely known or forms part of the common general knowledge in the field in Australia or any other country.

SUMMARY OF THE INVENTION

There is provided a cooling system for cooling computing devices operating in a data centre. The cooling system may comprise:
multiple cooling tanks, each of the cooling tanks being configured to accommodate a liquid coolant and sized to immerse the computing devices in the liquid coolant in order for the liquid coolant to absorb heat generated from the computing devices so as to cool the computing devices;
a set of connection pipes configured to fluidly connect the multiple cooling tanks to keep the liquid coolant in each of the multiple cooling tanks at a substantially same level;
a set of inlet pipes, the set of inlet pipes being fluidly connected to the multiple cooling tanks to supply the liquid coolant into the multiple cooling tanks;
a set of outlet pipes, the set of outlet pipes being fluidly connected to the multiple cooling tanks to release the liquid coolant carrying the heat absorbed from the computing devices out of the multiple cooling tanks;
a heat exchanger that fluidly connects to each of the set of inlet pipes to supply the liquid coolant into the set of inlet pipes and fluidly connects to each of the set of outlet pipes to receive from the set of outlet pipes the liquid coolant carrying the heat absorbed from the computing devices, the heat exchanger being configured to dissipate the heat from the liquid coolant carrying the heat; and
a coolant pump that fluidly connects to each of the set of outlet pipes, the coolant pump being configured to facilitate circulation of the liquid coolant in the multiple cooling tanks, the set of inlet pipes, the set of outlet pipes, and the heat exchanger.

The set of inlet pipes may comprise a main inlet pipe and multiple branch inlet pipes extending from and fluidly connecting to the main inlet pipe, wherein the main inlet pipe fluidly connects to the heat exchanger and each of the multiple branch inlet pipes fluidly connects to one of the multiple cooling tanks.

The set of outlet pipes may comprise a main outlet pipe and multiple branch outlet pipes extending from and fluidly connecting to the main outlet pipe, wherein the main outlet pipe fluidly connects to the heat exchanger via the coolant pump and each of the multiple branch outlet pipes fluidly connects to one of the multiple cooling tanks.

Each of the connection pipes may include a connection isolation valve to control fluid connection between two adjacent cooling tanks.

Each of multiple branch inlet pipes may comprise a balance valve to control a speed at which the liquid coolant flows into the cooling tank to which the branch inlet pipe is fluidly connected.

Each of multiple branch outlet pipes may comprise an outlet isolation valve to stop the liquid coolant carrying the heat flow out of the cooling tank to which the branch outlet pipe is fluidly connected.

The cooling system may further comprise a drain and fill system, the drain and fill system comprising:
a drain and fill pump;
a coolant reservoir; and
a set of drain and fill pipes comprising a main drain and fill pipe and multiple branch drain and fill pipes extending from the main drain and fill pipe and fluidly connected to one of the cooling tanks;
wherein the main drain and fill pipe is fluidly connected to the drain and fill pump, and the drain and fill pump is fluidly connected to the coolant reservoir.

Each of the branch drain and fill pipes may include a drain and fill valve.

the set of drain and fill pipes may further comprise:
a drain interconnection pipe fluidly connecting the main drain and fill pipe to the main outlet pipe, the drain interconnection pipe including a drain interconnection valve to control fluid connection between the main drain and fill pipe and the main outlet pipe; and a fill interconnection pipe fluidly connecting the main drain and fill pipe to the main outlet pipe, the fill interconnection pipe including a fill interconnection valve to control the fluid connection between the main drain and fill pipe and the main outlet pipe;

such that the liquid coolant can be drained into the main outlet pipe from one or more of the multiple cooling tanks and the liquid coolant can be filled into the one or more of the multiple cooling tanks from the main outlet pipe.

The cooling system may further comprise:

a water supply pipe fluidly connected to the heat exchanger to supply water into the heat exchanger in order for the heat exchanger to dissipate the heat into the water:

a water release pipe fluidly connected to the heat exchanger to release from the heat exchanger the water with the heat;

a cooling tower that is fluidly connected to the water supply pipe and the water release pipe, the cooling tower being configured to supply the water into the water supply pipe, receive from the water release pipe the water with heat, and release the heat from the water so as to cool down the water before supplying the water into the water supply pipe; and a water pump that is fluidly connected to the cooling tower and the water supply pipe to facilitate circulation of the water in the water supply pipe, the water release pipe, the cooling tower, and the heat exchanger.

The heater exchanger may comprise:

a set of coolant channels fluidly connected to the main outlet pipe to receive from the main outlet pipe the liquid coolant carrying the heat absorbed from the computing devices and fluidly connected to the main inlet pipe to supply the liquid coolant into the main inlet pipe;

a set of water channels fluidly connected to the water supply pipe and the water release pipe, the set of water channels being configured to be fluidly isolated from the set of coolant channels but thermally coupled to the set of coolant channels in order for the heat to be dissipated from the liquid coolant to the water.

The cooling tower may comprise a temperature control mechanism to set the temperature of the water that is supplied into the water supply pipe.

The cooling tower may comprise an evaporative cooling tower.

Each of the multiple cooling tanks may comprise:

a container forming a working space to accommodate the liquid coolant, wherein the container includes a coolant inlet, a coolant outlet, a first connection member, and a second connection member, the coolant inlet being configured to fluidly connect to one of the set of inlet pipes, the coolant outlet being configured to fluidly connect to one of the set of outlet pipes, the first connection member being configured to fluidly connect to a first connection pipe of the set of connection pipes, the second connection member being configured to fluidly connect to a second connection pipe of the set of connection pipes;

a separation panel extending in the working space of the container to separate the working space into a cooling space and a return space, wherein the cooling space is fluidly coupled to the coolant inlet, the return space is fluidly coupled to the coolant outlet, the first connection member, and the second connection member, the separation panel being configured such that the liquid coolant in the cooling space flows into the return space due to supply of the liquid coolant into the cooling space via the coolant inlet and the coolant outlet is further configured to release the liquid coolant carrying the heat absorbed from the computing devices out of the return space.

The container of each of the multiple cooling tanks may comprise:

a bottom panel having a first edge, a second edge adjacent to the first edge, a third edge adjacent to the second edge and opposite to the first edge, and a fourth edge connecting the third edge with the first edge;

a first side wall extending from the first edge;

a second side wall extending from the second edge;

a third side wall extending from the third edge;

a fourth side wall extending from the fourth edge, wherein the bottom panel, the first side wall, the second side wall, the third side wall, and the fourth side wall form the working space.

The coolant inlet, the coolant outlet, the first connection member, and the second connection member may be located on the bottom panel.

The separation panel may extend from the bottom panel along the first side wall and the third side wall to separate the working space into the cooling space and the return space such that the first side wall, the third side wall, the fourth side wall, the bottom panel and the separation panel form the cooling space, and the first side wall, the second side wall, the third side wall, the bottom panel and the separation panel form the return space.

The separation panel may have a first height that enables the cooling space to fluidly communicate with the return space above the separation panel such that the liquid coolant in the cooling space is able to flow into the return space.

The coolant outlet may extend from the bottom panel and have a top opening lower than the first height of the separation panel such that the top opening of the coolant outlet is immersed into the liquid coolant carrying the heat absorbed from the computing devices so as to allow the liquid coolant carrying the heat to flow out of the return space.

Each of the multiple cooling tanks may further comprise a coolant distribution panel including multiple holes and extending in the cooling space to cover the coolant inlet so as to evenly distribute the liquid coolant and regulate pressure of the liquid coolant entering the cooling space.

At least some of the multiple holes of the coolant distribution panel may be configured to be aligned with the at least one of the computing devices.

The diameter of the multiple holes may be 3 millimetres.

There is provided a cooling tank for cooling computing devices operating in a data centre. The cooling tank may comprise:

a container forming a working space to accommodate a liquid coolant, wherein the container includes a coolant inlet, a coolant outlet, a first connection member, and a second connection member, the coolant inlet being configured to fluidly connect to one of a set of inlet pipes, the coolant outlet being configured to fluidly connect to one of a set of outlet pipes, the first connection member being configured to fluidly connect to a first connection pipe of a set of connection pipes, the second connection member being configured to fluidly connect to a second connection pipe of the set of connection pipes;

a separation panel extending in the working space of the container to separate the working space into a cooling space and a return space, wherein the cooling space is fluidly coupled to the coolant inlet, the return space is fluidly coupled to the coolant outlet, the first connection member, and the second connection member, the separation panel being configured such that the liquid coolant in the cooling space flows into the return space due to supply of the liquid coolant into the cooling space via the coolant inlet and the coolant outlet is further configured to release the liquid coolant carrying the heat absorbed from the computing devices flows out of the return.

The container may comprise:

a bottom panel having a first edge, a second edge adjacent to the first edge, a third edge adjacent to the second edge and opposite to the first edge, and a fourth edge connecting the third edge with the first edge;

a first side wall extending from the first edge;

a second side wall extending from the second edge;

a third side wall extending from the third edge;

a fourth side wall extending from the fourth edge, wherein the bottom panel, the first side wall, the second side wall, the third side wall, and the fourth side wall form the working space.

The coolant inlet, the coolant outlet, the first connection member, and the second connection member may be located on the bottom panel.

The separation panel may extend from the bottom panel along the first side wall and the third side wall to separate the working space into the cooling space and the return space such that the first side wall, the third side wall, the fourth side wall, the bottom panel and the separation panel form the cooling space, and the first side wall, the second side wall, the third side wall, the bottom panel and the separation panel form the return space.

The separation panel may have a first height that enables the cooling space to fluidly communicate with the return space above the separation panel such that the liquid coolant in the cooling space is able to flow into the return space.

The coolant outlet may extend from the bottom panel and has a top opening lower than the first height of the separation panel such that the top opening of the coolant outlet is immersed into the liquid coolant carrying the heat absorbed from the computing devices so as to allow the liquid coolant carrying the heat to flow out of the return space.

The cooling tank may further comprise a coolant distribution panel including multiple holes and extending in the cooling space to cover the coolant inlet so as to evenly distribute the liquid coolant and regulate pressure of the liquid coolant entering the cooling space.

At least some of the multiple holes of the coolant distribution panel may be configured to be aligned with the at least one of the computing devices.

The diameter of the multiple holes may be 3 millimetres.

Other aspects of the invention are also disclosed in the present disclosure.

BRIEF DESCRIPTION OF THE DRAWINGS

Notwithstanding any other forms which may fall within the scope of the present disclosure, embodiments of the invention will now be described, by way of example only, with reference to the accompanying drawings in which.

Figure 1A:
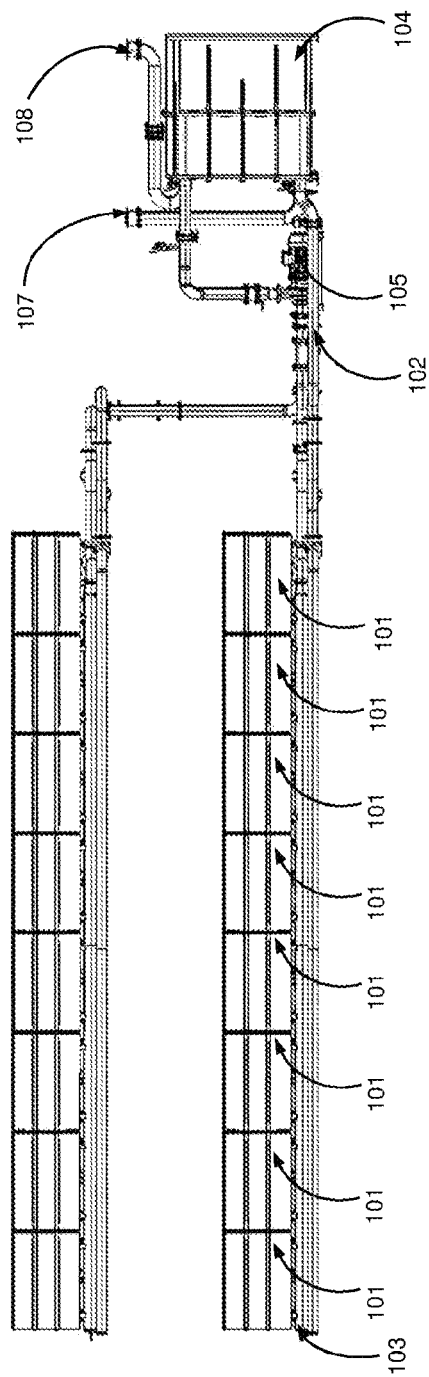
FIG. 1A illustrates an example of a cooling system in accordance with the present disclosure.

It should be noted in the accompanying drawings and description below that like or the same reference numerals in different drawings denote the same or similar elements. Also, the dimension lines and associated dimensions in the accompanying drawings are for illustration purposes only, and these elements should not be interpreted as limitations to the present disclosure.

DESCRIPTION OF EMBODIMENTS

Figure 1B:
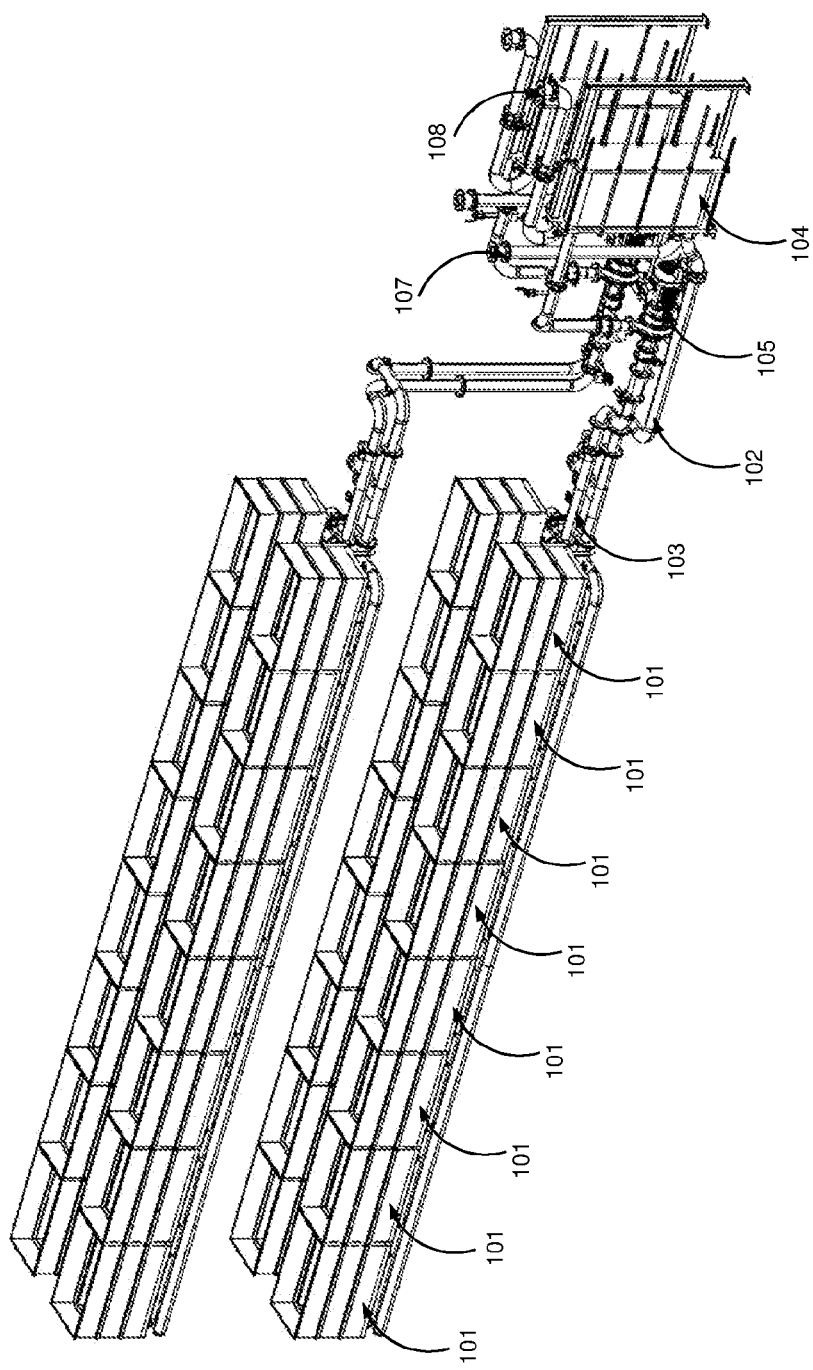
FIG. 1B illustrates a perspective view of the cooling system shown in FIG. 1A.

FIG. 1A illustrates an example of a cooling system 100 in accordance with the present disclosure. FIG. 1B illustrates a perspective view of the cooling system 100 shown in FIG. 1A;

The cooling system 100 can be used to cool computing devices operating in a data centre. The cooling system 100 includes multiple cooling tanks. As shown in FIGS. 1A and 1B, the exemplary cooling system 100 includes 32 cooling tanks on two decks, i.e., an upper deck and a lower deck. There are 16 cooling tanks arranged on each deck, and the 16 cooling tanks on each deck are arranged in two rows. As another example, the cooling system 100 may include 16 tanks on the two decks with 8 tanks on each deck. It should be noted that the cooling system 100 can include more or less decks or cooling tanks and a different number of cooling tanks can be arranged on each of the decks, without departing from the scope of the present disclosure. Further, the cooling tanks on each deck can be arranged in one row or more than two rows without departing from the scope of the present disclosure. The description below in relation to the elements installed on the lower deck also applies to the elements installed on the upper deck or other deck(s) if any. The description below in relation to a row of cooling tanks on a deck also applies to another row of cooling tanks on the same deck. As another example, a cooling system 100 as described with reference to FIGS. 1A, 1B and other related figures may be used as a sub cooling system, and another cooling system 100 may be used as another sub cooling system. The two sub cooling systems 100 can be fluidly connected together to form a cooling system. Such a cooling system including more than one sub cooling systems 100 is also described in the present disclosure. Further, a pipe in the present disclosure can be a straight pipe, a bent pipe, a curved pipe, or a combination of pipes in different shapes. A pipe can also include one or more segments that are fluidly connected. The one or more segments of a pipe can extend towards the same direction or different directions. Further, the reference to the segments of a pipe is not to define the structure of the pipe, but to indicate different portions of the pipe for easy description.

For ease of description, the multiple cooling tanks on the lower deck are denoted as 101. Although not denoted, the cooling tanks on the upper deck have the same structure and work in the same way as the cooling tanks 101 on the lower deck. Each of the cooling tanks 101 is configured to accommodate a liquid coolant and sized to immerse the computing devices (not shown in FIGS. 1A and 1B, but shown in FIGS. 6 to 8) in the liquid coolant in order for the liquid coolant to absorb heat generated from the computing devices so as to cool the computing devices. During operation of the cooling system 100 and the data centre, one or more computing devices or servers are placed in each of the cooling tanks 101, and the heat generated from the computing devices is absorbed by the liquid coolant in the cooling tanks 101 to reduce the temperature of the computing devices. As a result, the liquid coolant around the computing devices heats up and its temperature becomes higher. The liquid coolant can be for example a cooling oil.

The cooling system 100 also comprises a set of inlet pipes 102. The set of inlet pipes 102 are fluidly connected to the multiple cooling tanks 101 to supply the liquid coolant into the multiple cooling tanks 101. The liquid coolant is supplied into the cooling tanks 101 from the bottoms of the cooling tanks 101 via the set of inlet pipes 102.

The cooling system 100 also comprises a set of outlet pipes 103. The set of outlet pipes 103 are fluidly connected to the multiple cooling tanks 101 to release the liquid coolant carrying the heat absorbed from the computing devices out of the multiple cooling tanks 101. The liquid coolant carrying the heat is released out of the cooling tanks 101 from the bottoms of the cooling tanks 101 via the set of outlet pipes 103.

The cooling system 100 also comprises a heat exchanger 104. The heat exchanger 104 fluidly connects to each of the set of inlet pipes 102 directly or indirectly to supply the liquid coolant into the set of inlet pipes 102. The heat exchanger 104 also fluidly connects to each of the set of outlet pipes 103 directly or indirectly to receive from the set of outlet pipes 103 the liquid coolant carrying the heat absorbed from the computing devices. The heat exchanger 104 is configured to dissipate the heat from the liquid coolant carrying the heat. Therefore, the temperature of the liquid coolant is reduced and the liquid coolant is supplied into the set of inlet pipes 102 and in turn the multiple cooling tanks 101 to cool down the computing devices immersed in the liquid coolant in the multiple cooling tanks 101.

The cooling system 100 also comprises a coolant pump 105 that fluidly connects to each of the set of outlet pipes 103 directly or indirectly. The coolant pump 105 is configured to facilitate circulation of the liquid coolant in the multiple cooling tanks 101, the set of inlet pipes 102, the set of outlet pipes 103, and the heat exchanger 104.

In the cooling system 100, the heat exchanger 104 fluidly connects to the multiple cooling tanks 101 via the set of inlet pipes 102 and the set of outlet pipes 103. Further, the coolant pump 105 fluidly connects to the multiple cooling tanks 101 via the set of outlet pipes 102. Such a structure makes it unnecessary for the multiple cooling tanks 101 to have their individual heat exchangers and their individual coolant pumps to dissipate the heat and circulate the liquid coolant because the heat exchanger 104 and the coolant pump 105 are shared by the multiple cooling tanks 101. Therefore, the cooling system 100 allows a scalable deployment of the data centre. The data centre with such a cooling system is able to achieve a lower PUE of 1.03 or even lower, or a higher power density, and requires less land footprint.

Figure 2:
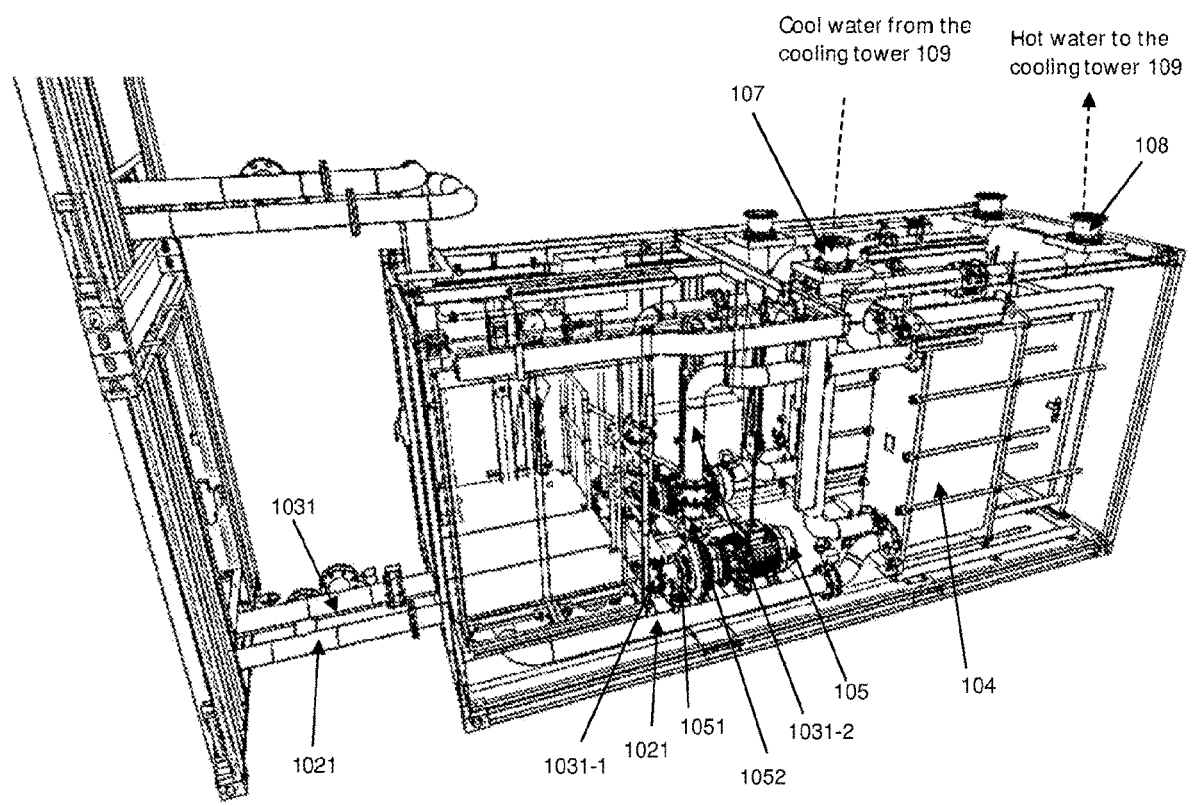
FIG. 2 illustrates a part of the cooling system in accordance with the present disclosure.
Figure 3:
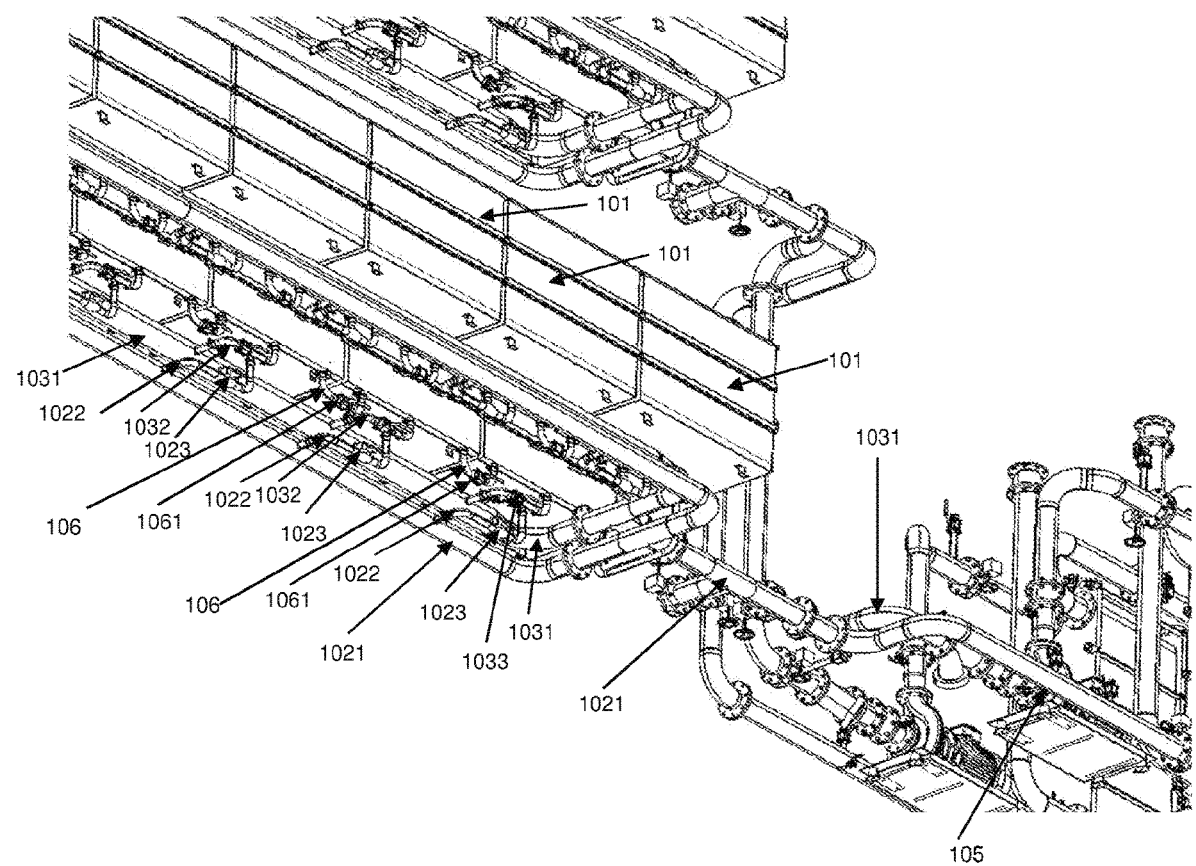
FIG. 3 illustrates an example of a set of inlet pipes and an example of a set of outlet pipes in accordance with the present disclosure.

FIG. 2 illustrates a part of the cooling system 100 in accordance with the present disclosure. FIG. 3 illustrates an example of the set of inlet pipes 102 and an example of the set of outlet pipes 103 in accordance with the present disclosure.

The set of inlet pipes 102 extends under the multiple cooling tanks 101, which are not all shown in FIG. 3 for ease of illustration. The set of inlet pipes 102 comprises a main inlet pipe 1021 (also shown in FIG. 2) and multiple branch inlet pipes 1022 extending from the main inlet pipe 1021. The multiple branch inlet pipe 1022 fluidly connect to the main inlet pipe 1021. The main inlet pipe 1021 fluidly connects to the heat exchanger 104 (also shown in FIG. 2) and each of the multiple branch inlet pipes 1022 fluidly connects to one of the multiple cooling tanks 101. Therefore, the liquid coolant flows into the multiple cooling tanks 101 through the heat exchanger 104 and the set of inlet pipes 102 (i.e., the main inlet pipe 1021 and the multiple branch pipes 1022). There may also be a support rack (not show in FIG. 3) under the multiple cooling tanks 101 to support the multiple cooling tanks 101. The main inlet pipe 1021 may be secured to the support rack.

Each of multiple branch inlet pipes 1022 comprises a balance valve 1023 to control a speed at which the liquid coolant flows into the cooling tank 101 to which the branch inlet pipe 1022 is fluidly connected. The liquid coolant in a branch inlet pipe 1022 has a higher pressure where the branch inlet pipe 1022 is closer to the heat exchanger 104 as the liquid coolant is pumped by the pump 105 out of the heat exchanger 104. The pressure in the branch inlet pipe 1022 drops along the main coolant inlet 1021 depending on how far the branch inlet pipe 1022 is away from the heat exchanger 104. The balance valves 1023 on the multiple branch inlet pipes 1022 are configured to make sure that liquid coolant flows into the individual cooling tanks 101 via their corresponding branch inlet pipes 1022 at a uniform speed. The balance valve(s) 1023 can also be closed to isolate one or more of the cooling tanks 101 if necessary, for example when the one or more cooling tanks 101 need to be drained for operational requirements and serviceability, as described with reference to a drain and fill system 120 shown FIGS. 1C to 1F.

The set of outlet pipes 103 extends under the multiple cooling tanks 101. The set of outlet pipes 103 comprises a main outlet pipe 1031 (also shown in FIG. 2) and multiple branch outlet pipes 1032 extending from the main outlet pipe 1031. The multiple branch outlet pipes 1032 fluidly connect to the main outlet pipe 1031. The main outlet pipe 1031 fluidly connects to the heat exchanger 104 via the coolant pump 105. As shown in FIG. 2, the coolant pump 105 includes a pump inlet 1051 to draw the liquid coolant carrying the heat into the coolant pump 105, and a pump outlet 1052 to discharge the liquid coolant carrying the heat from the pump 105. A first segment 1031-1 of the main outlet pipe 1031 is fluidly connected to the pump inlet 1051 of the coolant pump 105, while a second segment 1031-2 of the main outlet pipe 1031 is fluidly connected to the pump outlet 1052 of the coolant pump 105. Each of the multiple branch outlet pipes 1032 fluidly connects to one of the multiple cooling tanks 101. Therefore, the liquid coolant carrying the heat flows out of the multiple cooling tanks 101 back to the heat exchanger 104 via the set of outlet pipes 103 (i.e., the main outlet pipe 1031 and the multiple branch outlet pipes 1032) and the coolant pump 105. The heat in the liquid coolant is dissipated by the heat exchanger 104, then the liquid coolant flows into the multiple cooling tanks 101 from the heat exchanger 104 via the set of inlet pipes 102 (i.e., the main inlet pipe 1021 and the multiple branch pipes 1022). The main outlet pipe 1031 may be secured to the support rack. Each of the branch outlet pipes 1032 may have an outlet isolation valve 1033. The outlet isolation valve(s) 1033 can be closed to isolate parts of the cooling system 100 or stop the liquid coolant carrying the heat flow out of the cooling tank (s) 101 to which the branch outlet pipe 1032 is fluidly connected for operational requirements and serviceability, as described with reference to the drain and fill system 120 shown FIGS. 1C to 1F.

As shown in FIG. 3, the cooling system 100 further comprises a set of connection pipes 106. The set of connection pipes 106 is configured to fluidly connect the multiple cooling tanks 101 to keep the liquid coolant in each of the multiple cooling tanks 101 at a substantially same level. Each of the set of connection pipes 106 connects two adjacent cooling tanks 101 at the bottoms of the cooling tanks 101. For example, two connection pipes 106 are fluidly connected to a cooling tank 101 at the bottom of the cooling tank 101. One of the two connection pipes 106 fluidly connects the cooling tank 101 to an adjacent cooling tank 101 on one side, while another one of the two connection pipes 106 fluidly connects the cooling tank 101 to another adjacent cooling tank 101 on the other side, as shown in FIG. 3. Each of these connection pipes 106 may further have a connection isolation valve 1061 to control the fluid connection between two adjacent cooling tanks 101. The connection isolation valves 1061 can be opened or closed to adjust the volume of the liquid coolant in each of the cooling tanks 101. Particularly, the connection isolation valves 1061 can be opened or closed to keep the liquid coolant in each of the cooling tanks 101 at a substantially same level. The connection isolation valves 1061 can also be closed to isolate parts of the cooling system 100 for operational requirements and serviceability. As an example, the connection isolation valves 1061 of two connection pipes 106 fluidly connected to a cooling tank 101 can be closed to isolate the cooling tank 101. This way, the liquid coolant stops flowing between the cooling tank 101 and its adjacent cooling tanks 101. As a result, the liquid coolant can be drained from the cooling tank 101 or filled into the cooling tank 101 for service purposes, as described with reference to the drain and fill system 120 shown FIGS. 1C to 1F.

The cooling system 100 can further comprise a drain and fill system 120, as shown in FIGS. 1C to 1F.

Figure 1C:
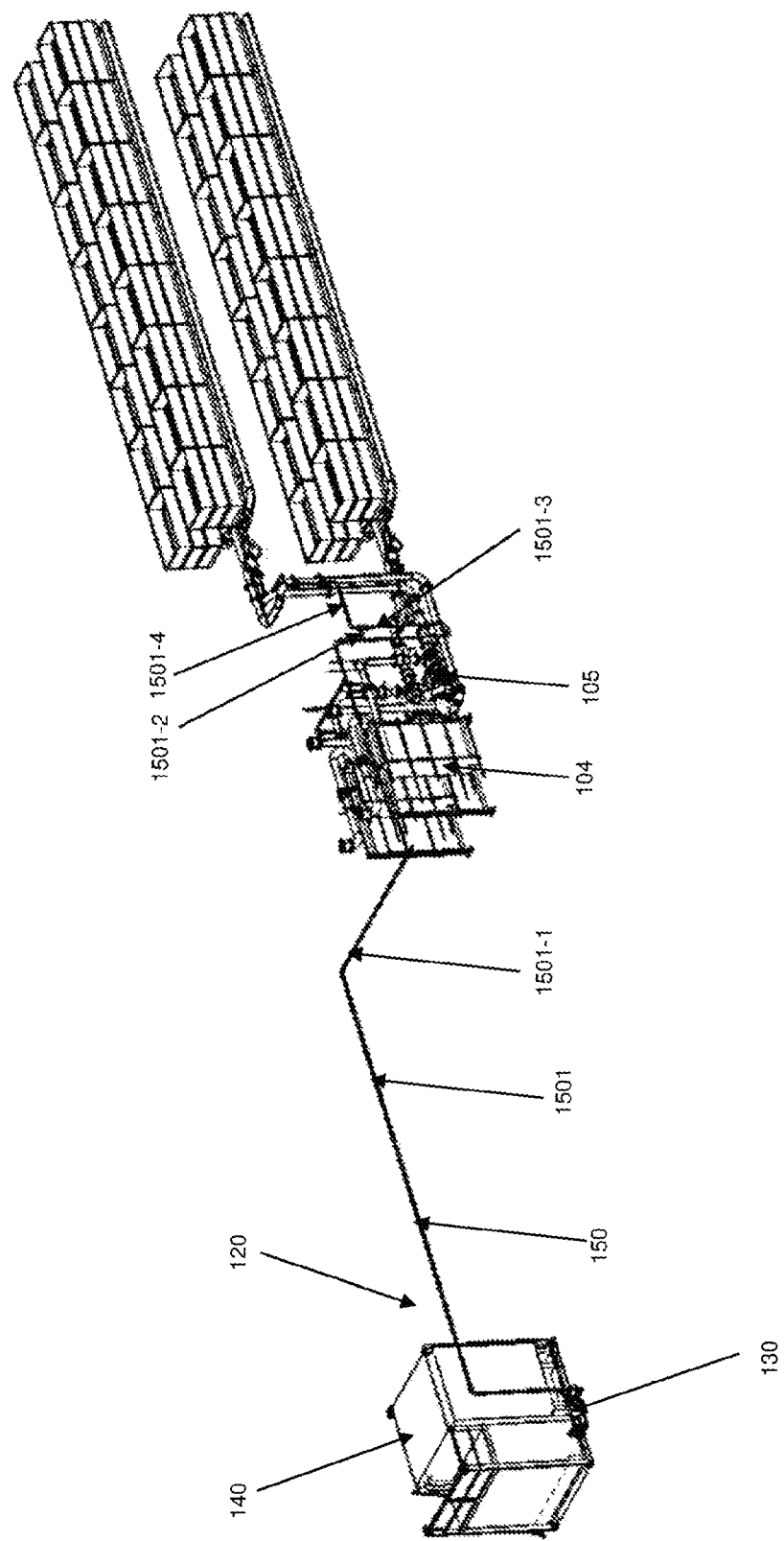
FIGS. 1C to 1F illustrate the cooling system with a drain and fill system in accordance with the present disclosure.
Figure 1D:
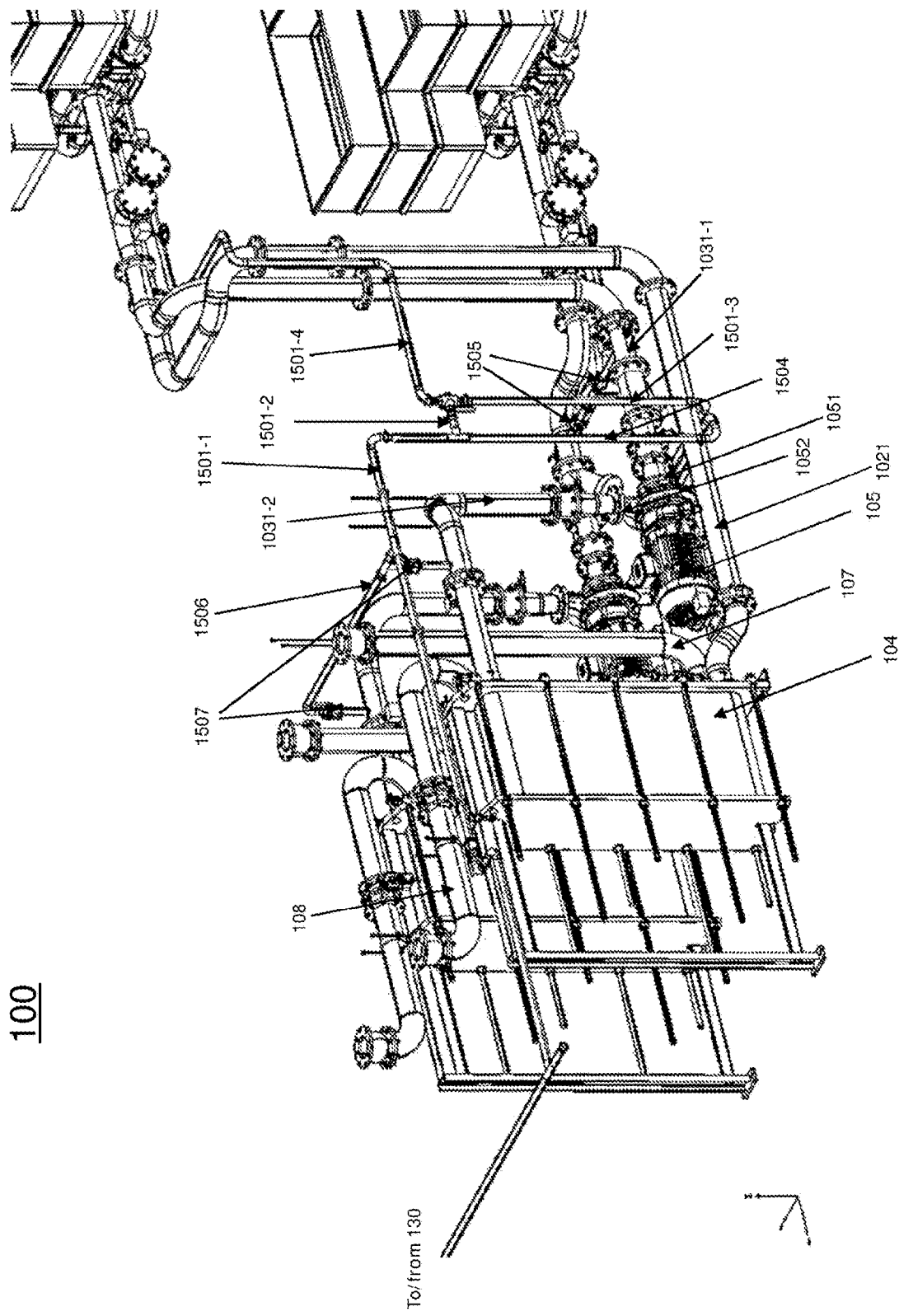
Figure 1E:
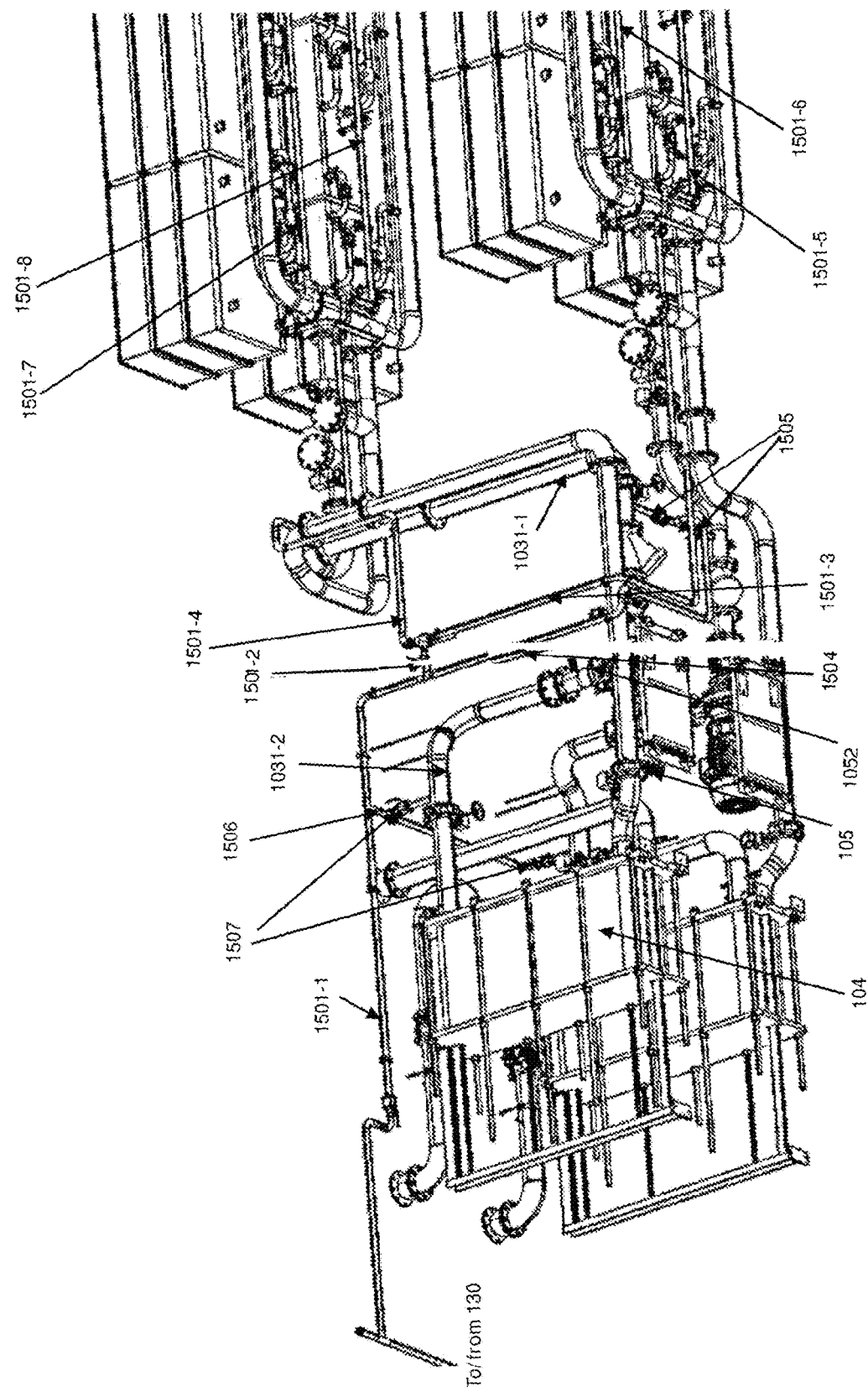
Figure 1F:
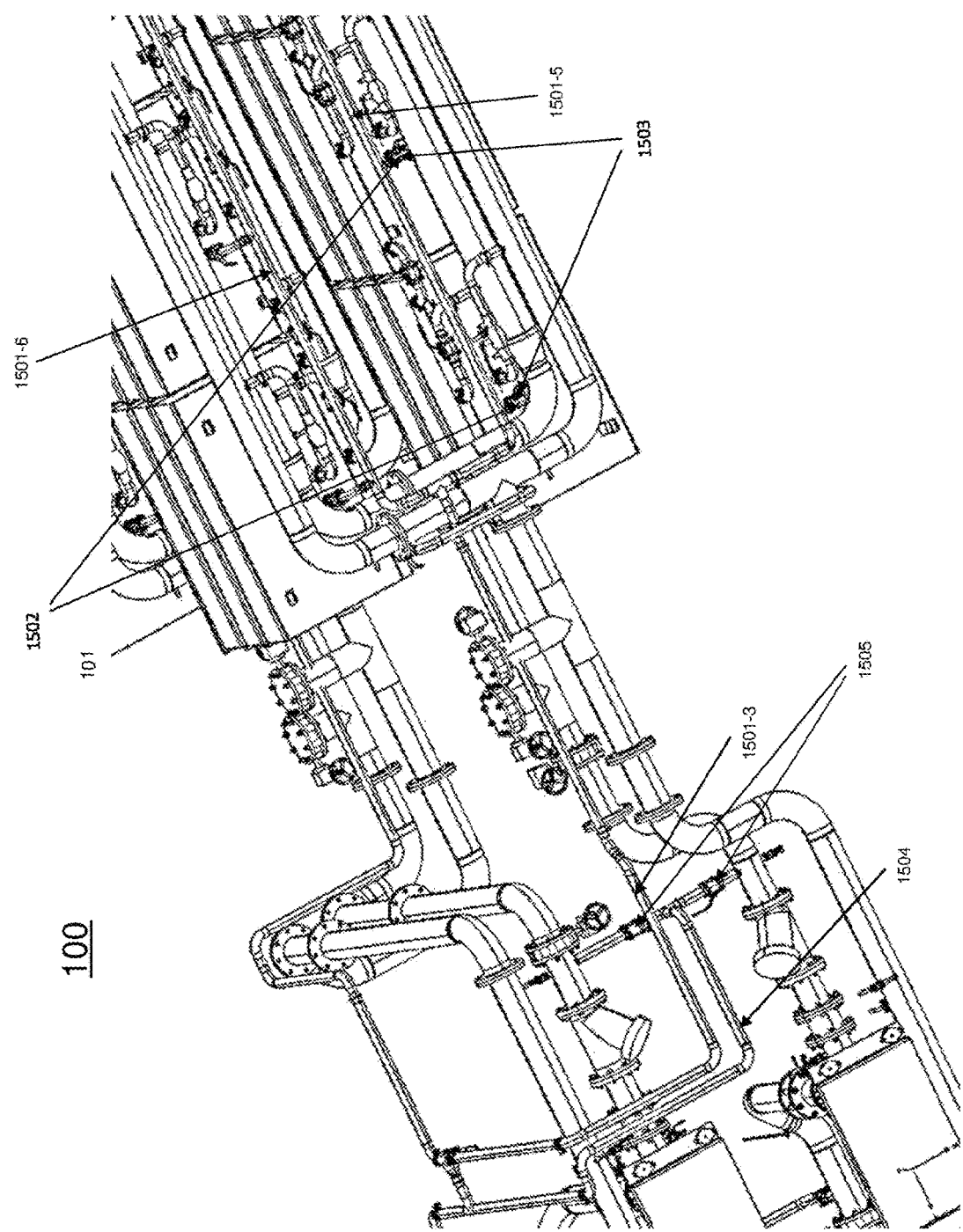

FIG. 1C illustrates the cooling system 100 with the drain and fill system 120. As shown in FIG. 1C, the drain and fill system 120 includes a drain and fill pump 130, a coolant reservoir 140, and a set of drain and fill pipes 150. The coolant reservoir 140 stores the liquid coolant. The drain and fill pump 130 is fluidly connected to the coolant reservoir 140 and the set of drain and fill pipes 150. FIG. 1D is a partial top perspective view of the cooling system 100 to illustrate the set of drain and fill pipes 150. FIG. 1E is a partial bottom perspective view of the cooling system 100 to illustrate the set of drain and fill pipes 150. FIG. 1F is another partial bottom perspective view of the cooling system 100 to illustrate the set of drain and fill pipes 150.

The drain and fill system 120 is configured to drain the liquid coolant from one or more cooling tanks 101 and fill the liquid coolant into one or more cooling tanks 101. This way, if the one or more cooling tanks 101 need to be serviced, the drain and fill system 120 drains the liquid coolant from one or more cooling tanks 101. After the service is finished, the drain and fill system 120 fills the liquid coolant into the one or more cooling tanks 101. The process of draining and filling the one or more cooling tanks 101 is described below with reference to following examples.

Drain and Fill Example 1

The set of drain and fill pipes 150 includes a main drain and fill pipe 1501 and multiple branch drain and fill pipes 1502. The main drain and fill pipe 1501 is fluidly connected to the drain and fill pump 130, which is in turn fluidly connected to the coolant reservoir 140. The main drain and fill pipe 1501 may include one or more segments. Specifically, in the exemplary cooling system 100 including two decks and two rows of cooling tanks 101 on each deck, the main drain and fill pipe 1501 includes a first segment 1501-1 fluidly connected to the drain and fill pump 130, a second segment 1501-2 extending from the first segment 1501-1, a third segment 1501-3 (for the lower deck) extending from the second segment 1501-2, a fourth segment 1501-4 (for the upper deck) extending from the second segment 1501-2, a fifth segment 1501-5 (for the first row on the lower deck) extending from the third segment 1501-3, a sixth segment 1501-6 (for the second row on the lower deck) extending from the third segment 1501-3, a seventh segment 1501-7 (for the first row on the upper deck) extending from the fourth segment 1501-4, and an eighth segment 1501-8 (for the second row on the upper deck) extending from the fourth segment 1501-4. It should be noted that the cooling system 100 may have a different number of segments without departing from the scope of the present disclosure. As an example, if the cooling system 100 only includes one deck (for example, the lower deck), and the deck only includes one row (for example, the first row) of cooling tanks 101, then the main drain and fill pipe 1501 may only include the first segment 1501-1, the second segment 1501-2, the third segment 1501-3, and the fifth segment 1501-5.

Each of the branch drain and fill pipes 1502 extends from the main drain and fill pipe 1501, particularly, the fifth segment 1501-5, the sixth segment 1501-6, the seventh segment 1501-7, or the eighth segment 1501-8, and is fluidly connected to one of the cooling tanks 101, for example, at the bottom of the cooling tank 101. Each of the branch drain and fill pipes 1502 also includes a drain and fill valve 1503 that controls the fluid connection between the branch drain and fill pipes 1502 and the corresponding cooling tank 101. If the drain and fill valve 1503 is opened, the branch drain and fill pipes 1502 is fluidly connected to the cooling tank 101. On the other hand, if the drain and fill valve 1503 is closed, the branch drain and fill pipes 1502 is fluidly disconnected with the cooling tank 101.

When the cooling system 100 is in normal operation, all the drain and fill valves 1503 are closed and the fluid connection between the cooling tanks 101 and the drain and fill system 120 is disconnected. If the one or more cooling tanks 101 need to be serviced, the coolant pump 105 is stopped. Specifically, if the one or more cooling tanks 101 to be serviced are located on the upper deck, then the coolant pump 105 for the upper deck is stopped. If the one or more cooling tanks 101 to be serviced are located on the lower deck, then the coolant pump 105 for the lower deck is stopped. If the cooling tanks 101 to be serviced are located on both decks, then both coolant pumps 105 are stopped.

After the coolant pump(s) 105 is stopped, the one or more drain and fill valves 1503 connected to the one or more cooling tanks 101 to be serviced are opened to fluidly connect the one or more cooling tanks 101 to the drain and fill system 120, particularly, the corresponding one or more branch drain and fill pipes 1502. Also, the corresponding balance valve(s) 1023, outlet isolation valve(s) 1033, and connection isolation valve(s) 1061 are closed to isolate the one or more cooling tanks 101. The drain and fill pump 130 is then started to drain the liquid coolant from the one or more cooling tanks 101 into the coolant reservoir 140 for serviceability. Specifically, the liquid coolant flows out of the one or more cooling tanks 101 via the corresponding one or more branch drain and fill pipes 1502, and flows into one or more of the fifth segment 1501-5, the sixth segment 1501-6, the seventh segment 1501-7 and the eighth segment 1501-8 of the main drain and fill pipe 1501 depending on where the one or more cooling tanks 101 to be serviced are located. The liquid coolant then flows through the third segment 1501-3 and/or the fourth segment 1501-4 of the main drain and fill pipe 1501. The liquid coolant then flows through the second segment 1501-2 and the first segment 1501-1 of the main drain and fill pipe 1501 and is drained into the coolant reservoir 140. After the liquid coolant is drained from the one or more cooling tanks 101, the service can be performed by a technician. After the service is finished, the drain and fill pump 130 is started in a reversed direction to fill the liquid coolant into the one or more cooling tanks 101 that have been serviced. Specifically, the liquid coolant flows out of the coolant reservoir 140 and flows through the first segment 1501-1 and the second segment 1501-2 of the main drain and fill pipe 1501. The liquid coolant then flows through the third segment 1501-3 and/or the fourth segment 1501-4 of the main drain and fill pipe 1501 depending on where the one or more cooling tanks 101 to be serviced are located. The liquid coolant then flows through one or more of the fifth segment 1501-5, the sixth segment 1501-6, the seventh segment 1501-7 and the eighth segment 1501-8 of the main drain and fill pipe 1501. The liquid coolant is then filled into the one or more cooling tanks 101 via the corresponding one or more branch drain and fill pipes 1502. After the liquid coolant is filled back into the one or more cooling tanks 101, the corresponding one or more drain and fill valves 1503 are closed to disconnect the fluid connection between the cooling tanks 101 and the drain and fill system 120. Also, the corresponding balance valve(s) 1023, outlet isolation valve(s) 1033, and connection isolation valve(s) 1061 that were closed are opened, and the coolant pump(s) 105 is started. This way, the cooling system 100 goes back to normal operation.

The above drain and fill system 120 can also be used to fill all the cooling tanks 101 of the cooling system 100 with the liquid coolant stored in the coolant reservoir 140 when initialising the cooling system 100.

The problem with the above drain and fill system 120 is that even if there is only one cooling tank 101 (or a few cooling tanks 101) needs to be serviced, the coolant pump(s) 105 needs to be stopped. As a result, the normal operation of the entire cooling system 100 may be interrupted if both coolant pumps 105 are stopped or the normal operation of one deck of the cooling system 100 may be interrupted if one of the coolant pumps 105 is stopped. The solution to the problem is described in Drain and Fill Example 2.

Drain and Fill Example 2

The set of drain and fill pipes 150 further comprises a drain interconnection pipe 1504 fluidly connecting the main drain and fill pipe 1501 to the first segment 1031-1 of the main outlet pipe 1031, which fluidly connects to the pump inlet 1051 of the coolant pump 105. In the exemplary cooling system 100, the drain interconnection pipe 1504 extends from the main drain and fill pipe 1501 to the first segment 1031-1 of the main outlet pipe 1031 near the pump inlet 1051 of the coolant pump 105. In the exemplary cooling system 100, the drain interconnection pipe 1504 connects the main drain and fill pipe 1501 to the first segments 1031-1 of the main outlet pipes 1031 for both upper and lower decks. The drain interconnection pipe 1504 includes a drain interconnection valve 1505 to control the fluid connection between the main drain and fill pipe 1501 and the first segment 1031-1 of the main outlet pipe 1031. In the exemplary cooling system 100, the drain interconnection pipe 1504 includes two drain interconnection valves 1505 because the drain interconnection pipe 1504 connects the main drain and fill pipe 1501 to the first segments 1031-1 of the main outlet pipes 1031 for both upper and lower decks.

The set of drain and fill pipes 150 further comprises a fill interconnection pipe 1506 fluidly connecting the main drain and fill pipe 1501 to the second segment 1031-2 of the main outlet pipe 1031, which fluidly connects to the pump outlet 1052 of the coolant pump 105. In the exemplary cooling system 100, the fill interconnection pipe 1506 extends from the main drain and fill pipe 1501 to the second segment 1031-2 of the main outlet pipe 1031 near the pump outlet 1052 of the coolant pump 105. In the exemplary cooling system 100, the fill interconnection pipe 1506 connects the main drain and fill pipe 1501 to the second segments 1031-2 of the main outlet pipes 1031 for both upper and lower decks. The fill interconnection pipe 1506 includes a fill interconnection valve 1507 to control the fluid connection between the main drain and fill pipe 1501 and the second segment 1031-2 of the main outlet pipe 1031. In the exemplary cooling system 100, the fill interconnection pipe 1506 includes two fill interconnection valves 1507 because the fill interconnection pipe 1506 connects the main drain and fill pipe 1501 to the second segments 1031-2 of the main outlet pipes 1031 for both upper and lower decks.

When the cooling system 100 is in normal operation, the drain interconnection valve(s) 1505 is closed to disconnect the fluid connection between the main drain and fill pipe 1501 and the main outlet pipe 1031. The fill interconnection valve(s) 1507 is also closed to disconnect the fluid connection between the main drain and fill pipe 1501 and the main outlet pipe 1031. If one or more cooling tanks 101 need to be serviced, the one or more drain and fill valves 1503 connected to the one or more cooling tanks 101 to be serviced are opened to fluidly connect the one or more cooling tanks 101 to the drain and fill system 120, particularly, the corresponding one or more branch drain and fill pipes 1502. The drain interconnection valve(s) 1505 is also opened. Further, the corresponding balance valve(s) 1023, outlet isolation valve(s) 1033, and connection isolation valve(s) 1061 are closed to isolate the one or more cooling tanks 101. This way, the liquid coolant in the cooling tanks 101 is drained into the main outlet pipe 1031, particularly, the first segment 1031-1 of the main outlet pipe 1031. Specifically, the liquid coolant flows out of the one or more cooling tanks 101 via the corresponding one or more branch drain and fill pipes 1502, and flows into one or more of the fifth segment 1501-5, the sixth segment 1501-6, the seventh segment 1501-7 and the eighth segment 1501-8 of the main drain and fill pipe 1501 depending on where the one or more cooling tanks 101 to be serviced are located. The liquid coolant then flows through the third segment 1501-3 and/or the fourth segment 1501-4 of the main drain and fill pipe 1501. The liquid coolant then flows through the second segment 1501-2 of the main drain and fill pipe 1501 and the drain interconnection pipe 1504. The liquid coolant is then drained into the first segment 1031-1 of the main outlet pipe 1031. The liquid coolant is then drawn into the coolant pump 105 via the pump inlet 1051 of the coolant pump 105, and discharged to the heat exchanger 104 via the pump outlet 1052 of the coolant pump 105. The liquid coolant is then distributed to other cooling tanks 101 in the cooling system 100. As this approach is used to drain a small number of the cooling tanks 101 to be serviced, the liquid coolant in the small number of the cooling tanks 101 will not substantially raise the level of the liquid coolant in other cooling tanks 101. After the liquid coolant is drained from the one or more cooling tanks 101, the drain interconnection valve(s) 1505 is closed and the one or more drain and fill valves 1503 are also closed. This is to prevent the coolant pump 105 from sucking air into the cooling system 100 during the service because the coolant pump 105 does not stop operation during the service. Then the service can be performed by a technician.

After the service is finished, the fill interconnection valve(s) 1507 is opened to fluidly connect the main drain and fill pipe 1501 to the main outlet pipe 1031, and the one or more drain and fill valves 1503 are opened to fluidly connect the one or more cooling tanks 101 to the drain and fill system 120. This way, the liquid coolant in the main outlet pipe 1031 is filled into the one or more cooling tanks 101 that have been serviced. Specifically, the liquid coolant flows out of the second segment 1301-2 of the main outlet pipe 1301, which fluidly connects to the pump outlet 1052 of the coolant pump 105, and flows through the fill interconnection pipe 1506. The liquid coolant then flows through the first segment 1501-1 and the second segment 1501-2 of the main drain and fill pipe 1501. The liquid coolant then flows through the third segment 1501-3 and/or the fourth segment 1501-4 of the main drain and fill pipe 1501 depending on where the one or more cooling tanks 101 are located. The liquid coolant then flows through one or more of the fifth segment 1501-5, the sixth segment 1501-6, the seventh segment 1501-7 and the eighth segment 1501-8 of the main drain and fill pipe 1501. The liquid coolant is then filled into the one or more cooling tanks 101 via the corresponding one or more branch drain and fill pipes 1502. After the liquid coolant is filled back into the one or more cooling tanks 101, the corresponding one or more drain and fill valves 1503 are closed to disconnect the fluid connection between the cooling tanks 101 and the drain and fill system 120, and the fill interconnection valve(s) 1507 is also closed to disconnect the fluid connection between the main drain and fill pipe 1501 and the main outlet pipe 1031. Also, the corresponding balance valve(s) 1023, outlet isolation valve(s) 1033, and connection isolation valve(s) 1061 that were closed are opened. This way, the cooling system 100 goes back to normal operation. As this approach is used to fill a small number of the cooling tanks 101 that have been serviced with the liquid coolant in the main outlet pipe 1031, the liquid coolant filled into the small number of the cooling tanks 101 will not substantially lower the level of the liquid coolant in other cooling tanks 101.

With the drain interconnection pipe 1504 and the fill interconnection pipe 1506, the coolant pump(s) 105 does not need to be stopped or restarted. As a result, the operation of the entire or partial cooling system 100 is not interrupted.

In the cooling system 100, the heat exchanger 104 can dissipate the heat in the liquid coolant in different ways. An example is described below without excluding other implementations.

As shown in FIGS. 1A and 2, the cooling system 100 further comprises a water supply pipe 107 fluidly connected to the heat exchanger 104 to supply water (for example, cool water, as shown in FIG. 2) into the heat exchanger 104 in order for the heat exchanger 104 to dissipate the heat into the water. The cooling system 100 also comprises a water release pipe 108 fluidly connected to the heat exchanger 104 to release from the heat exchanger 104 the water with the heat (i.e., hot water, as shown in FIG. 2).

Figure 4:
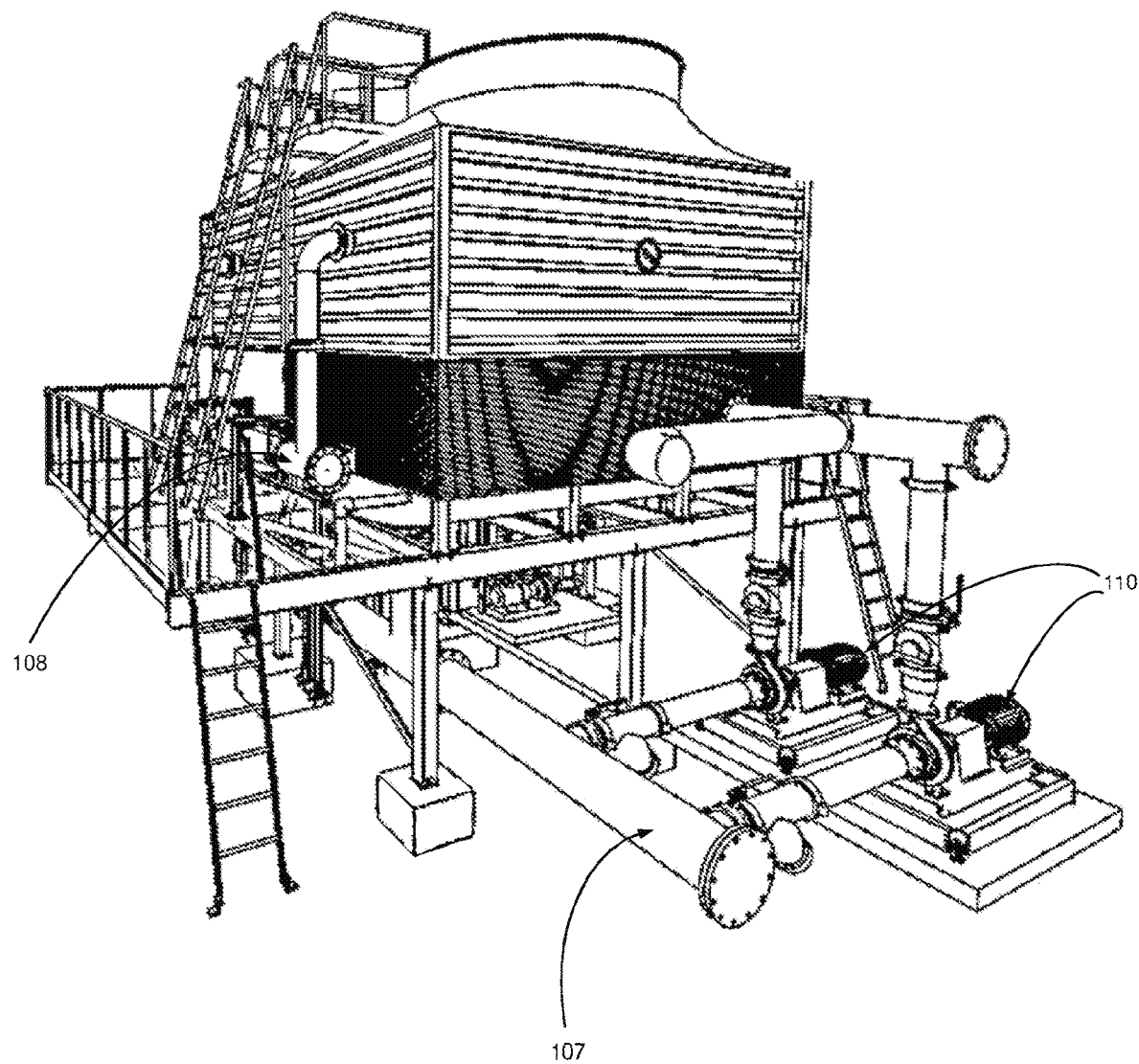
FIG. 4 illustrates an example of a cooling tower in accordance with the present disclosure.

The cooling system 100 further comprises a cooling tower 109. FIG. 4 illustrates an example of the cooling tower 109 in accordance with the present disclosure. The cooling tower 109 is fluidly connected to the water supply pipe 107 and the water release pipe 108. The cooling tower 109 is configured to supply the water into the water supply pipe 107 and in turn the heat exchanger 104 to absorb the heat from the liquid coolant to reduce the temperature of the liquid coolant. As a result, the water heats up and becomes hot water. The cooling tower 109 is also configured to receive from the water release pipe 108 the water with heat (i.e., the hot water) and release the heat from the water so as to cool down the water before supplying the water back into the water supply pipe 107 and in turn the heat exchanger 104. As a result, the temperature of the hot water is reduced at the cooling tower 109, and the hot water becomes cool water. The cool water is then supplied back to the water supply pipe 107 and in turn the heat exchanger 104.

As shown in FIG. 4, the cooling system 100 further comprises one or more water pumps 110. The water pump 110 is fluidly connected to the cooling tower 109 and the water supply pipe 107 to facilitate circulation of the water in the water supply pipe 107, the water release pipe 108, the cooling tower 109, and the heat exchanger 104.

The cooling tower 109 may be an evaporative cooling tower to release the heat from the water to the atmosphere. The cooling tower 109 may also comprise a temperature control mechanism (not shown in FIG. 4) to set the temperature of the water that is supplied into the water supply pipe 107.

The heat exchanger 104 can exchange heat with the cooling tower 109 in different ways, and an example of the heat exchanger 104 is given below, with reference to FIG. 4A, without excluding other implementations.

Figure 4A:
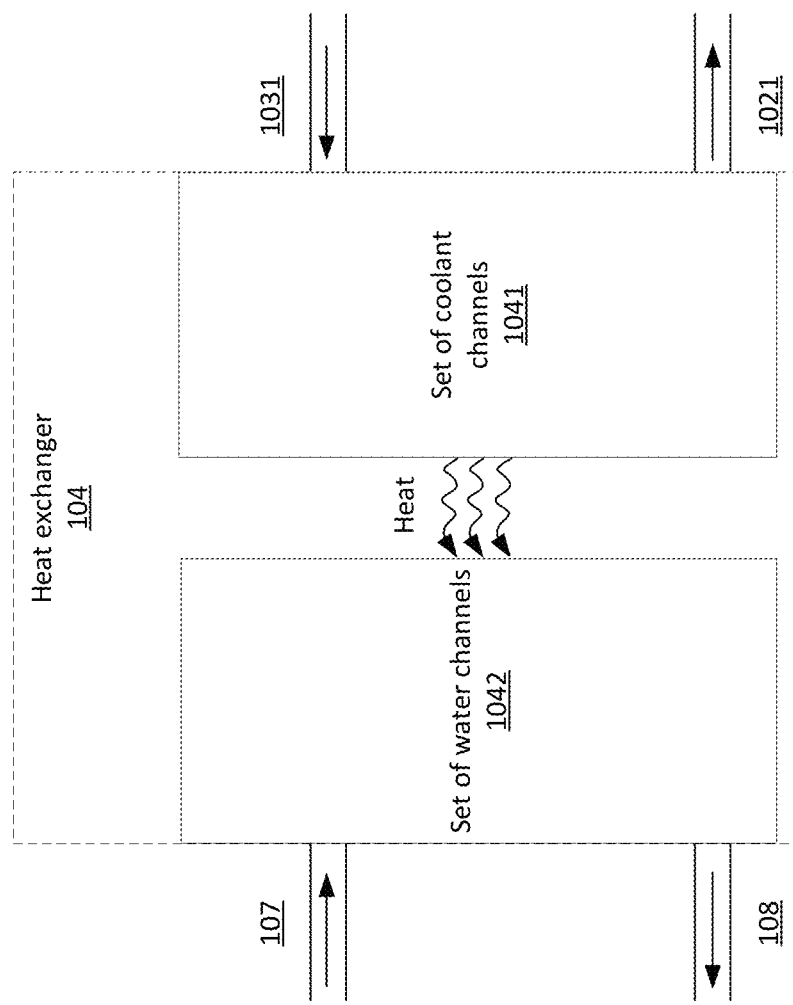
FIG. 4A shows an example schematic of the heat exchanger 104, in accordance with the present disclosure.

FIG. 4A shows a schematic of the heat exchanger 104 and its interaction with the cooling tower 109 and the cooling tanks 101, according to some embodiments. The heat exchanger 104 comprises a set of coolant channels 1041 fluidly connected to the main outlet pipe 1031 to receive from the main outlet pipe 1031 the liquid coolant carrying the heat absorbed from the computing devices. The set of coolant channels 1041 is also fluidly connected to the main inlet pipe 1021 to supply the liquid coolant into the main inlet pipe 1021 after the heat is dissipated. The heat exchanger 104 further comprises a set of water channels 1042 fluidly connected to the water supply pipe 107 and the water release pipe 108. The set of water channels 1042 are configured to be fluidly isolated from the set of coolant channels 1041 but thermally coupled to the set of coolant channels 1041 in order for the heat to be dissipated from the liquid coolant to the water. This way, the liquid coolant is not mixed with the water, but the heat in the liquid coolant can be dissipated from the liquid coolant to the water.

Specifically, the liquid coolant carrying the heat flows into the set of coolant channels 1041 of the heat exchanger 104 via the main outlet pipe 1031, and the water flows into the set of water channels 1042 via the water supply pipe 107 of the heat exchanger 104. The set of coolant channels 1041 are arranged close to the set of water channels 1042 to maintain fluid isolation and thermal communication. The heat in the liquid coolant is dissipated to the water due to for example thermal conductivity of the material of the heat exchanger 104 if the heat exchanger 104 is made of a thermally conductive material, for example, copper, stainless steel, etc. The water with the heat flows out of the set of water channels 1042 back to the cooling tower 109 via the water release pipe 108. Then the heat is released from the water to the atmosphere at the cooling tower 109. After the heat is dissipated to the water in the heat exchanger 104, the liquid coolant in the heat exchanger 104 is supplied back to the main inlet pipe 1021 and in turn the multiple cooling tanks 101 to cool the computing devices in the multiple cooling tanks 101.

Figure 5:
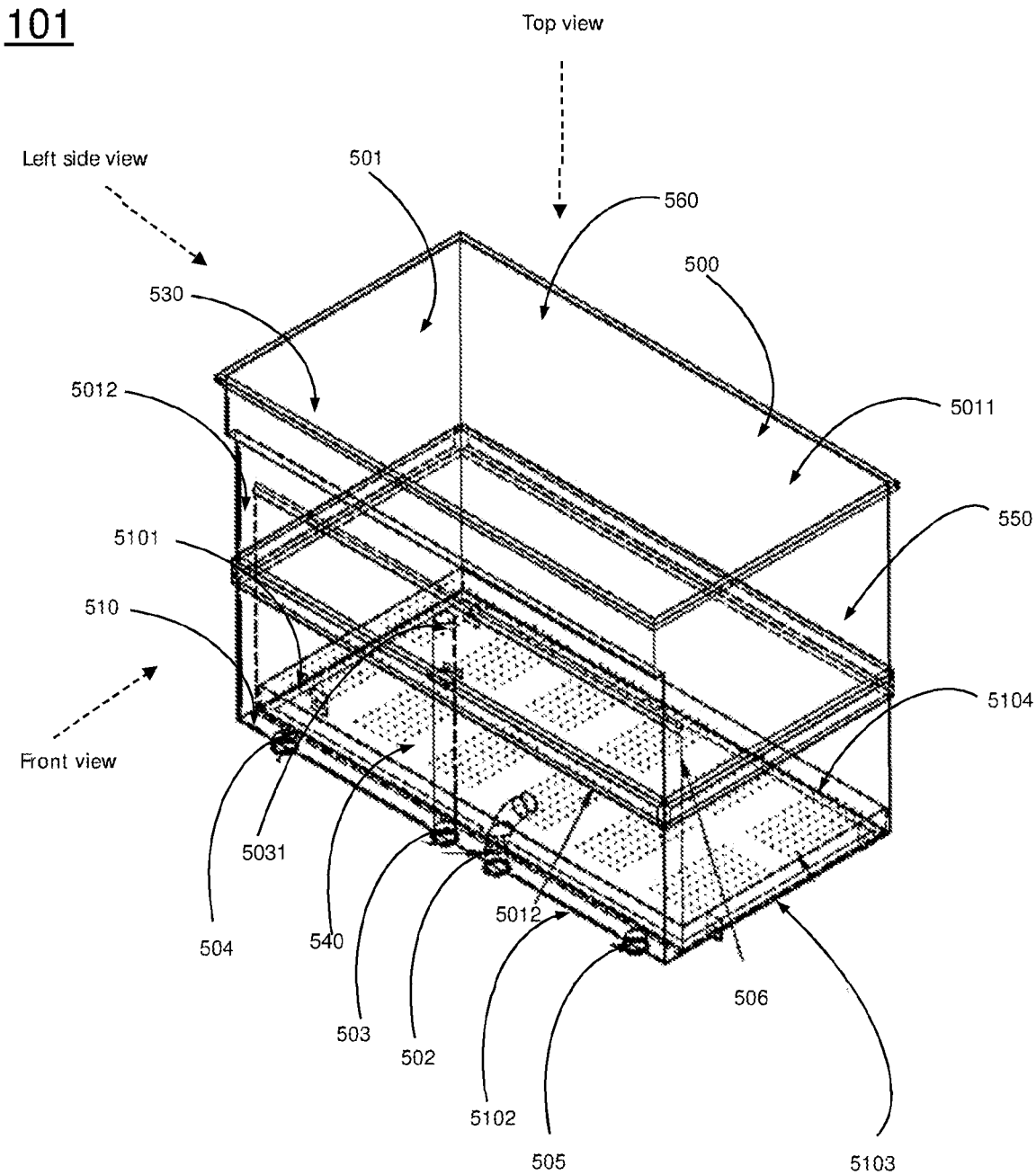
FIG. 5 illustrates a perspective view of an exemplary cooling tank in accordance with the present disclosure.
Figure 6:
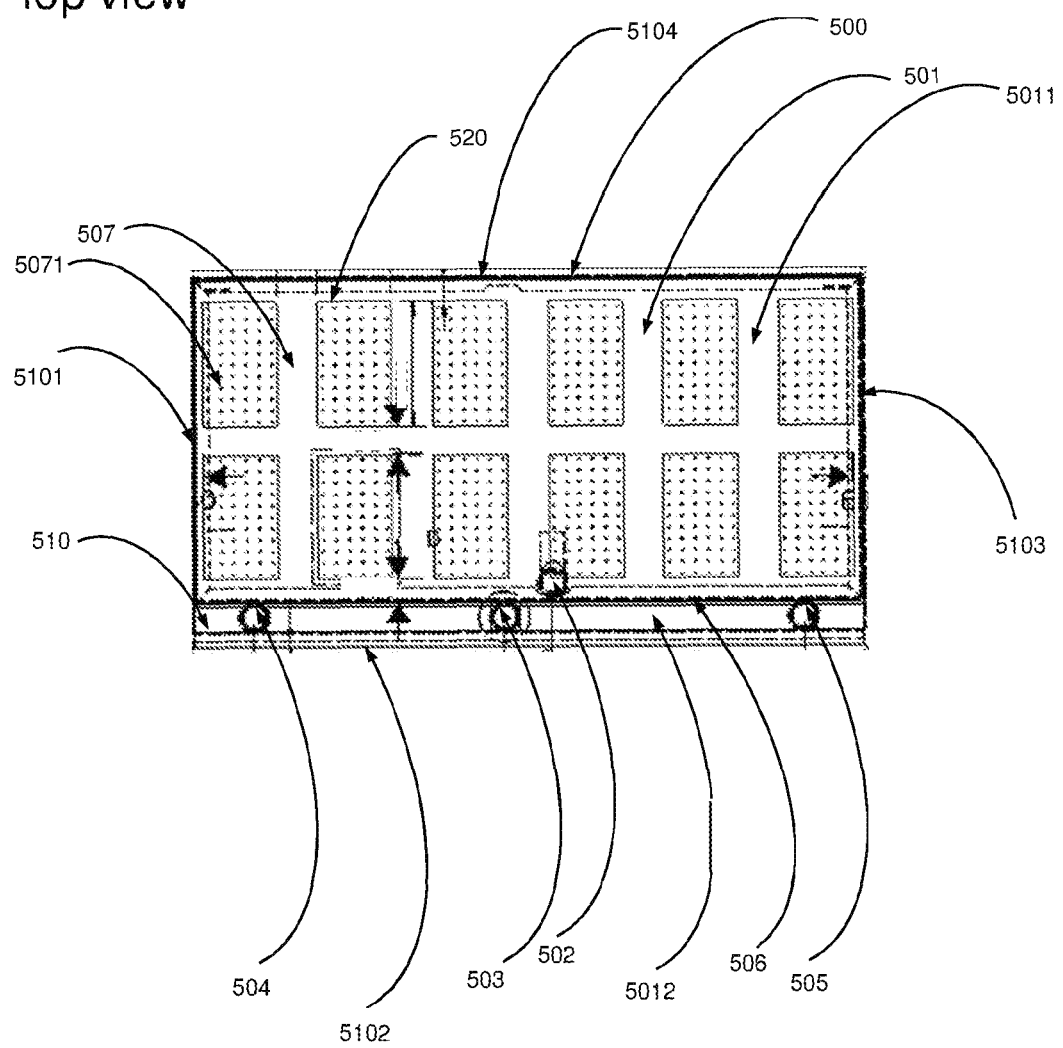
FIG. 6 illustrates a top view of an exemplary cooling tank in accordance with the present disclosure.
Figure 7:
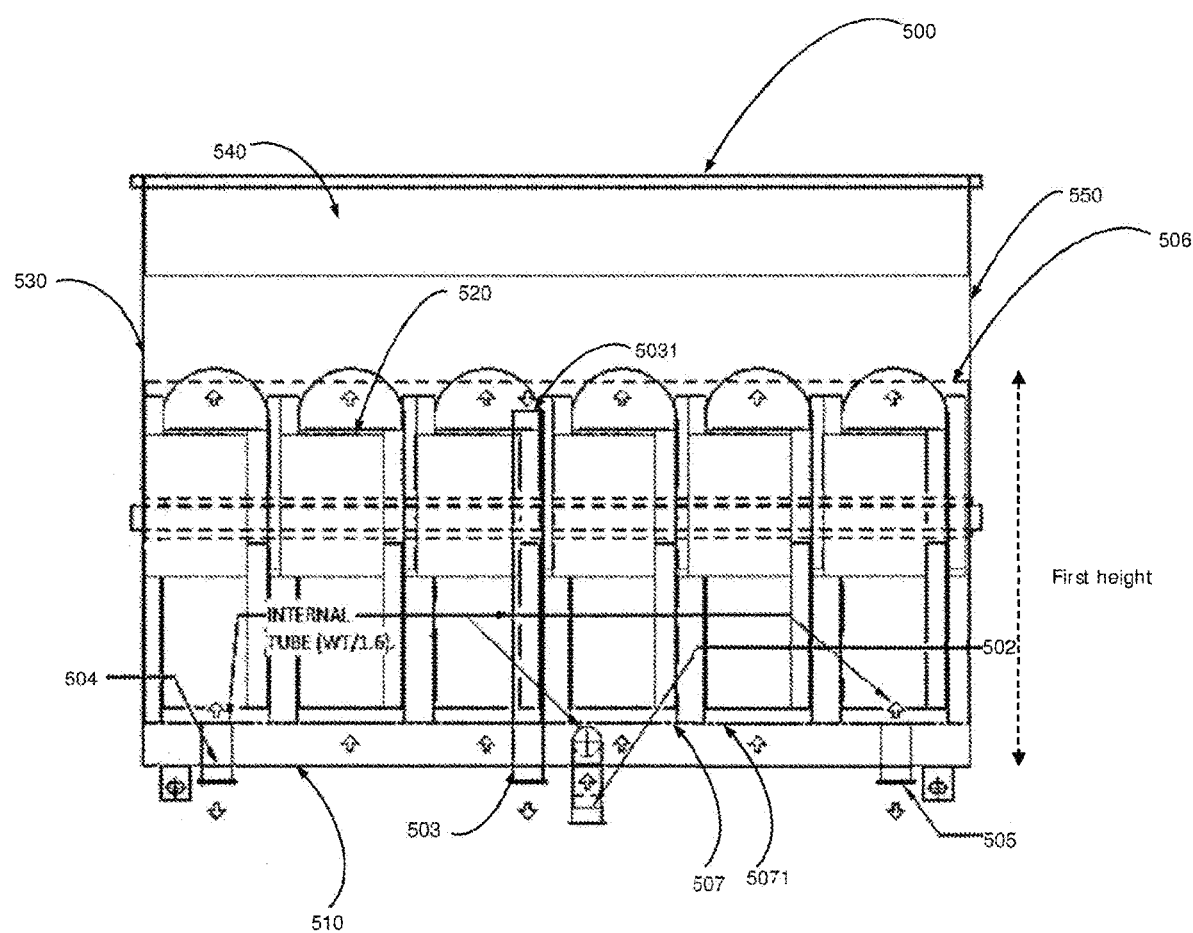
FIG. 7. illustrates a front view of an exemplary cooling tank in accordance with the present disclosure.
Figure 8:
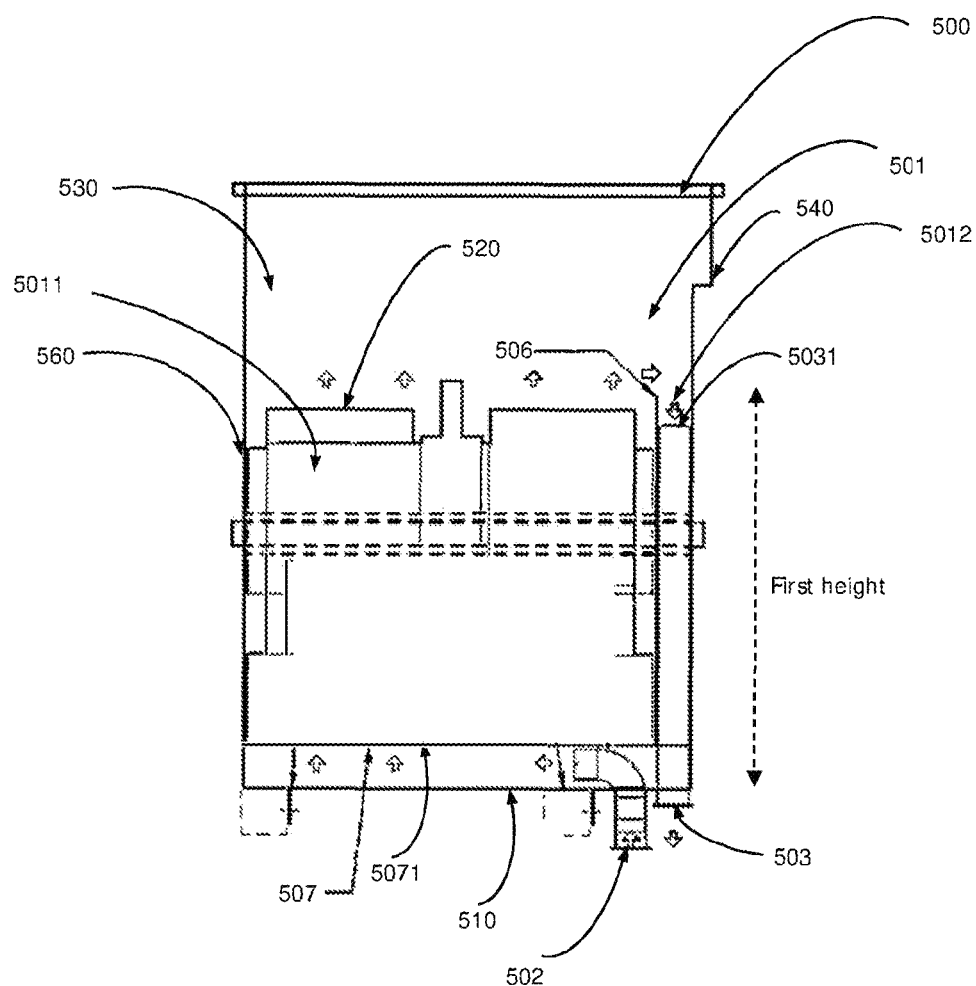
FIG. 8 illustrates a left side view of an exemplary cooling tank in accordance with the present disclosure.

An example of the cooling tank 101 is illustrated in FIGS. 5 to 8. FIG. 5 illustrates a perspective view of the cooling tank 101 in accordance with the present disclosure. FIG. 6 illustrates a top view of the cooling tank 101 in accordance with the present disclosure. FIG. 7. illustrates a front view of the cooling tank 101 in accordance with the present disclosure. FIG. 8 illustrates a left side view of the cooling tank 101 in accordance with the present disclosure.

The cooling tank 101 includes a container 500. The container 500 forms a working space 501 to accommodate the liquid coolant. The container 500 includes a coolant inlet 502, a coolant outlet 503, a first connection member 504, and a second connection member 505. The coolant inlet 502 is configured to fluidly connect to one of the set of inlet pipes 102, particularly, one of the branch inlet pipes 1022, to supply the liquid coolant to the cooling tank 101. The coolant outlet 503 is configured to fluidly connect to one of the set of outlet pipes 103 particularly, one of the branch outlet pipes 1032, to release the liquid coolant carrying the heat out of the cooling tank 101. The first connection member 504 is configured to fluidly connect to a first connection pipe (not shown in FIGS. 5 to 8) of the set of connection pipes 106, and the second connection member 505 is configured to fluidly connect to a second connection pipe of the set of connection pipes 106. The first connection pipe fluidly connects the cooling tank 101 to an adjacent cooling tank 101 (as shown in FIG. 3), and the second connection pipe fluidly connects the cooling tank 101 to another adjacent cooling tank 101 (as shown in FIG. 3).

The cooling tank 101 further comprises a separation panel 506 extending in the working space 501 of the container 500. The separation panel 506 is configured to separate the working space 501 into a cooling space 5011 and a return space 5012. As shown in FIGS. 5 and 6, the cooling space 5011 is fluidly coupled to the coolant inlet 502, and the computing devices 520 (shown in FIGS. 6 to 8) are placed in the cooling space 5011 during operation. The return space 5012 is fluidly coupled to the coolant outlet 503, the first connection member 504, and the second connection member 505. The separation panel 506 is configured such that the liquid coolant in the cooling space 5011 flows into the return space 5012 due to supply of the liquid coolant into the cooling space 5011 via the coolant inlet 502. The coolant outlet 503 is further configured to release the liquid coolant carrying the heat absorbed from the computing devices out of the return space 5012.

The way the liquid coolant flows in the cooling tank 101 is described with reference to FIGS. 7 and 8, particularly, see the arrows in FIGS. 7 and 8.

During the initialization phase, the liquid coolant, i.e., cool coolant, is supplied into the cooling space 5011 via the coolant inlet 502. The cool coolant is accumulated in the cooling space 5011 and the computing devices 520 in the cooling space 5011 are immersed in the cool coolant. With more cool coolant supplied into the cooling space 5011 via the coolant inlet 502, the cool coolant in the cooling space 5011 flows over the separation panel 506. The cool coolant flows into the return space 5012 and fill the return space 5012 of each cooling tank 101.

Once the initialisation of the cooling system 100 is completed and the computing devices 520 start operating, the cool coolant around the computing devices 520 heats up during operation of the computing devices 520 and the liquid coolant carrying the heat, i.e., hot coolant, moves up to the top of the cooling space 5011 due to convection.

With more cool coolant supplied into the cooling space 5011 via the coolant inlet 502, the hot coolant in the cooling space 5011 flows over the separation panel 506 and flows into the return space 5012. The hot coolant stays on the top of the return space 2012 due to its lower density, while the cool coolant that flows into the return space 2012 during the initialization phase stays at the bottom of the return space 2012 due to its higher density. The coolant outlet 503 is slightly lower than the separation panel 506 to release the hot coolant, i.e., the liquid coolant carrying the heat, out of the return space 5012.

In one embodiment, as shown in FIGS. 5 and 6, the container 500 of the cooling tank 101 comprises a bottom panel 510 having a first edge 5101, a second edge 5102 adjacent to the first edge 5101, a third edge 5103 adjacent to the second edge 5102 and opposite to the first edge 5101, and a fourth edge 5104 connecting the third edge 5103 with the first edge 5101. The container 500 further comprises a first side wall 530 extending from the first edge 5101, a second side wall 540 extending from the second edge 5102, a third side wall 550 extending from the third edge 5103, and a fourth side wall 560 extending from the fourth edge 5104. The bottom panel 510, the first side wall 530, the second side wall 540, the third side wall 550, and the fourth side wall 560 form the working space 501. The coolant inlet 502, the coolant outlet 503, the first connection member 504, and the second connection member 505 are located on the bottom panel 510.

The separation panel 506 extends from the bottom panel 510 along the first side wall 530 and the third side wall 550 to separate the working space 501 into the cooling space 5012 and the return space 5012, as best shown in FIGS. 5 and 8. Therefore, the first side wall 530, the third side wall 550, the fourth side wall 560, the bottom panel 510 and the separation panel 506 form the cooling space 5011 where the computing devices 520 are placed. The first side wall 530, the second side wall 540, the third side wall 550, the bottom panel 510 and the separation panel 506 form the return space 5012.

As shown in FIGS. 7 and 8, the separation panel 506 has a first height that enables the cooling space 5011 to fluidly communicate with the return space 5012 above the separation panel 506. The first height is less than the height of the side walls 530, 540, 550, 560 of the container 500. Therefore, the liquid coolant in the cooling space 5011 is able to flow over the separation panel 506 and flow into the return space 5012 due to continuous supply of the liquid coolant into the cooling space 5011, as indicated by the arrows in FIGS. 7 and 8.

The coolant outlet 503 extends from the bottom panel 510 and has a top opening 5031. The top opening 5061 is slightly lower than the first height of the separation panel 506 such that the top opening 5031 of the coolant outlet 503 is immersed into the liquid coolant carrying the heat absorbed from the computing devices, i.e., the hot coolant, because the hot coolant stays on the top of the return space 5012 due to its lower density. The remaining liquid coolant in the return space 5012, i.e., the cool coolant, stays below the hot coolant due to its higher density. In the present disclosure, the hot coolant does not mix with the cool coolant below the hot coolant due to the different densities.

The coolant outlet 503 allows the hot coolant to flow out of the return space 5012. In other words, the coolant outlet 503 releases the hot coolant out of the cooling tank 101, which in turn flows into the branch outlet pipe 1032 (not shown in FIGS. 5 to 8) fluidly connected to the coolant outlet 503.

Figure 9:
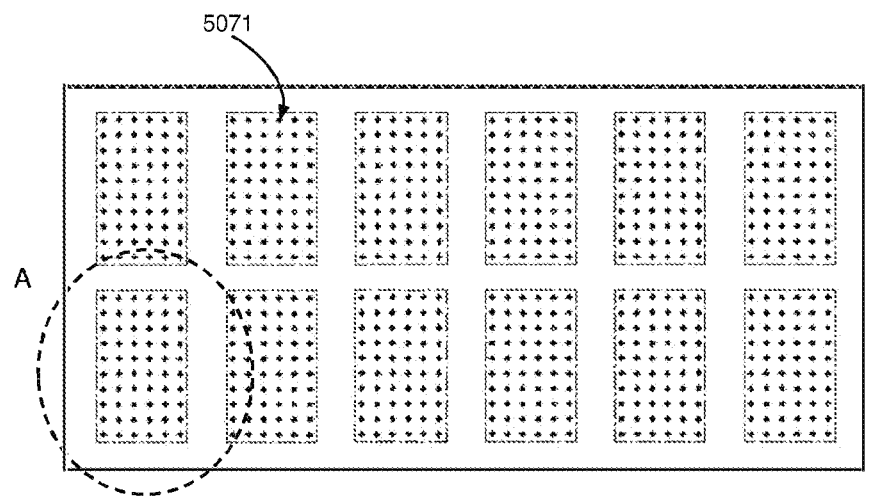
FIGS. 9(a) and (b) illustrate an exemplary coolant distribution panel in accordance with the present disclosure.
Figure 9:
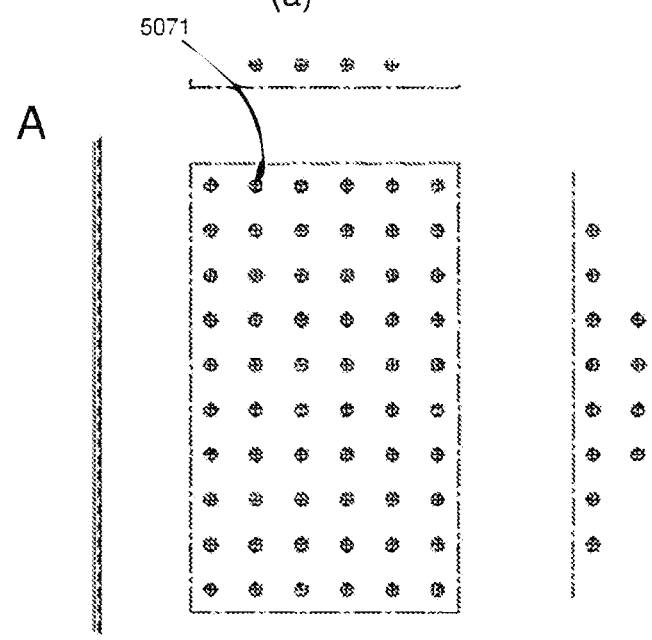

The cooling tank 101 further comprises a coolant distribution panel 507. FIGS. 9(a) and (b) illustrate an example of the coolant distribution panel 507 in accordance with the present disclosure. FIG. 9(b) is a partial view of FIG. 9(a).

The coolant distribution panel 507 is a plate having multiple holes 5071. The coolant distribution panel 507 extends in the cooling space 5011 to cover the coolant inlet 502. As shown in FIGS. 7 and 8, the coolant distribution panel 507 positioned over the bottom panel 510 and is substantially parallel with the bottom panel 510. The coolant inlet 502 is located between the coolant distribution panel 507 and the bottom panel 510. The coolant distribution panel 507 divides the cooling space 5011 into a first portion between the coolant distribution panel 507 and the bottom panel 510, and a second portion over the coolant distribution panel 507. The liquid coolant flows into the first portion of the cooling space 5011 via the coolant inlet 502 and then flows into the second portion of the cooling space 5011 through the multiple holes 5071. The computing devices 520 are placed over the coolant distribution panel 507 (particularly, in the second portion of the cooling space 5011) to be immersed in the liquid coolant flowing through the multiple holes 5071. The multiple holes 5071 are arranged to evenly distribute the liquid coolant and regulate pressure of the liquid coolant entering the cooling space 5011. Therefore, the multiple holes 5071 is able to avoid concentration of the liquid coolant flowing into the cooling space 5011 via the coolant inlet 502 by evenly distributing the liquid coolant, and the impact of the liquid coolant on the computing devices 520 in the cooling space 5011 can be reduced. As an example, each of the multiple holes has a diameter of 3 millimetres. In one embodiment, at least some of the multiple holes 5071 of the coolant distribution panel 507 are configured to be aligned with the at least one of the computing devices 520 to lead the liquid coolant to the computing device 520.

Figure 10A:
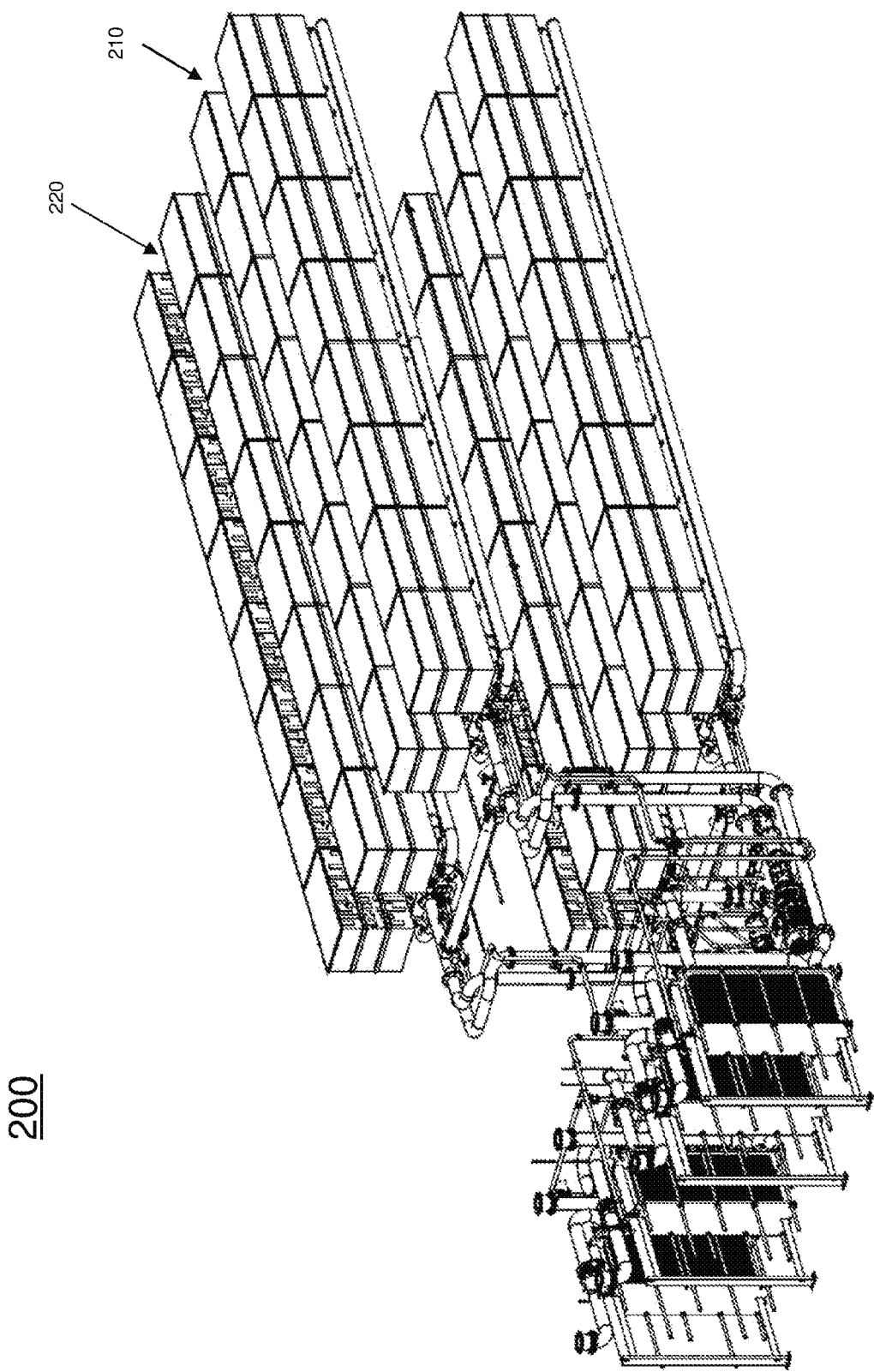
FIGS. 10A and 10B illustrate a cooling system including more than one sub cooling systems in accordance with the present disclosure.
Figure 10B:
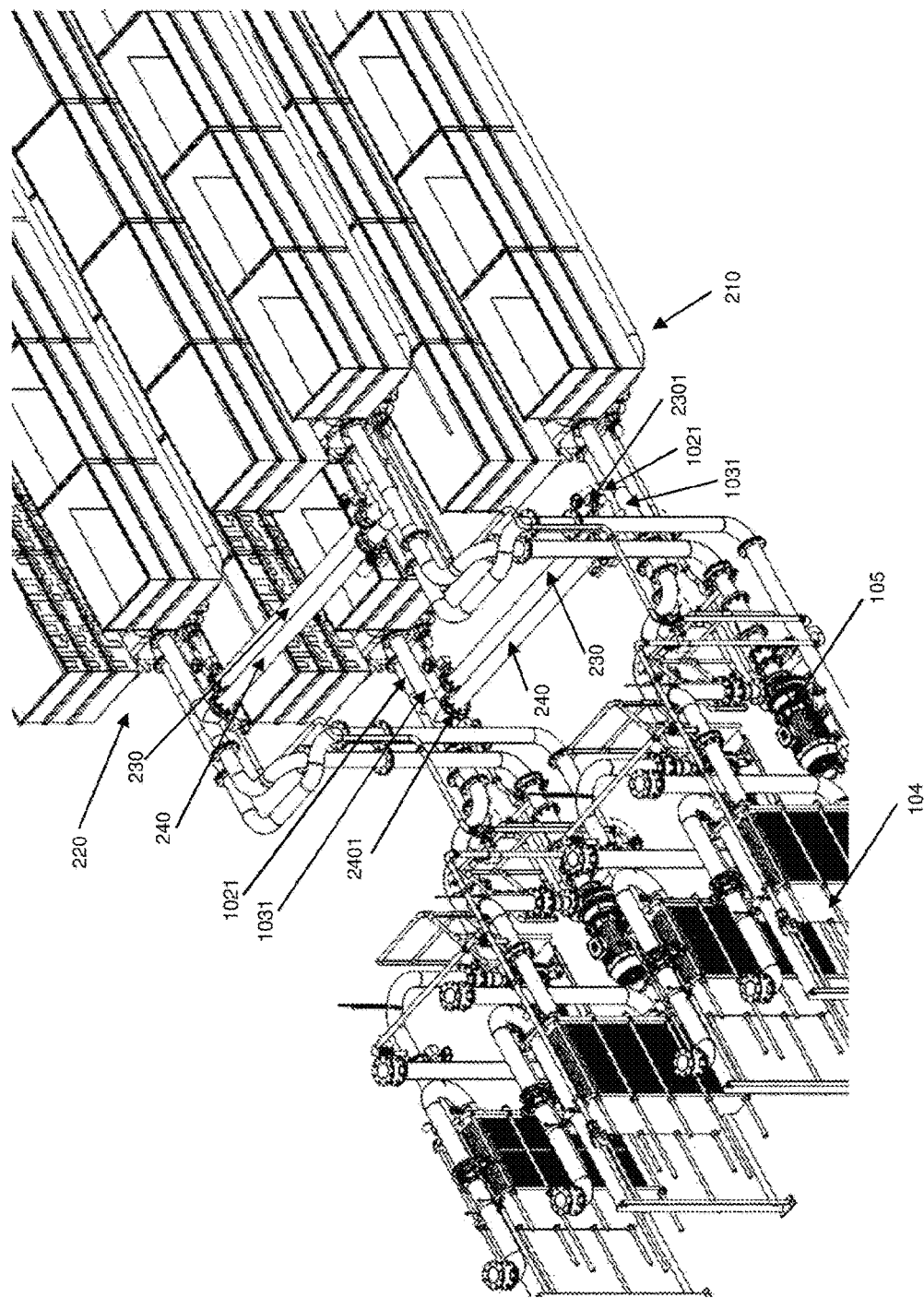

FIGS. 10A and 10B illustrate a cooling system 200 for cooling computing devices operating in a data centre in accordance with the present disclosure. The cooling system 200 comprises more than one sub cooling systems, particularly, a first sub cooling system 210, and a second sub cooling system 220, which is placed next to the first sub cooling system 210. Each of the sub cooling systems 210, 220 is a cooling system 100 as described above.

The cooling system 200 further comprises an inlet interconnection pipe 230 fluidly connecting the main inlet pipe 1021 of the first sub cooling system 210 with the main inlet pipe 1021 of the second sub cooling system 220 to allow the liquid coolant to flow between the main inlet pipe 1021 of the first sub cooling system 210 and the main inlet pipe 1021 of the second sub cooling system 220.

As the cooling system 100 (or 210, 220) as described above may include two decks, i.e., the upper deck and the lower deck in the exemplary cooling system 100 shown in the FIGS. 1A to FIG. 1F, FIGS. 10A and 10B, the cooling system 200 may include two inlet interconnection pipes 230 with one inlet interconnection pipes 230 fluidly connecting the main inlet pipe 1021 for the upper deck of the first sub cooling system 210 with the main inlet pipe 1021 for the upper deck of the second sub cooling system 220 and another inlet interconnection pipes 230 fluidly connecting the main inlet pipe 1021 for the lower deck of the first sub cooling system 210 with the main inlet pipe 1021 for the lower deck of the second sub cooling system 220.

The cooling system 100 (or 210, 220) may include more decks without departing from the scope of the present disclosure. This means the cooling system 200 may include more inlet interconnection pipes 230 to fluidly connect the main inlet pipes 1021 for the corresponding decks of the sub cooling systems 210, 220.

The cooling system 200 further comprises an outlet interconnection pipe 240 fluidly connecting the main outlet pipe 1031 of the first sub cooling system 210 with the main outlet pipe 1031 of the second sub cooling system 220 to allow the liquid coolant carrying the heat to flow between the main outlet pipe 1031 of the first sub cooling system 210 and the main outlet pipe 1031 of the second sub cooling system 220.

As the cooling system 100 (or 210, 220) as described above may include two decks, i.e., the upper deck and the lower deck in the exemplary cooling system 100 shown in the FIGS. 1A to FIG. 1F, FIGS. 10A and 10B, the cooling system 200 may include two outlet interconnection pipes 240 with one outlet interconnection pipes 240 fluidly connecting the main outlet pipe 1031 for the upper deck of the first sub cooling system 210 with the main outlet pipe 1031 for the upper deck of the second sub cooling system 220 and another outlet interconnection pipes 240 fluidly connecting the main outlet pipe 1031 for the lower deck of the first sub cooling system 210 with the main outlet pipe 1031 for the lower deck of the second sub cooling system 220.

The cooling system 100 (or 210, 220) may include more decks without departing from the scope of the present disclosure. This means the cooling system 200 may include more outlet interconnection pipes 240 to fluidly connect the main outlet pipes 1031 for the corresponding decks of the sub cooling systems 210, 220.

This way, if the coolant pump 105 or the heat exchanger 104 of one of the first sub cooling system 210 and the second sub cooling system 220 is out of action due to for example faults (as a result of a fault detection process), planned maintenance, a testing regime, etc., which may stop the circulation or heat exchange of the liquid coolant in the sub cooling system 210 or 220, the coolant pump 105 and the heat exchanger 104 of the other one of the first sub cooling system 210 and the second sub cooling system 220 can be used to facilitate the circulation or heat exchange of the liquid coolant in the sub cooling system.

The inlet interconnection pipe 230 includes an inlet interconnection valve 2301 that controls a speed the liquid coolant flows between the main inlet pipe 1021 of the first sub cooling system 210 and the main inlet pipe 1021 of the second sub cooling system 220.

The outlet interconnection pipe 240 includes an outlet interconnection valve 2401 to control a speed the liquid coolant carrying the heat flows between the main outlet pipe 1031 of the first sub cooling system 210 and the main outlet pipe 1301 of the second sub cooling system 220.

As an example, when the cooling system 200 is in normal operation, the inlet interconnection valve(s) 2301 and the outlet interconnection valve(s) 2401 are all closed to disconnect the fluid connection between the first sub cooling system 210 and the second sub cooling system 220. If the coolant pump 105 or the heat exchanger 104 of the first sub cooling system 210 stops working due to different reasons, the inlet interconnection valve(s) 2301 and the outlet interconnection valve(s) 2401 are opened to provide the fluid connection between the first sub cooling system 210 and the second sub cooling system 220. This way, the circulation of the liquid coolant in the first sub cooling system 210 is facilitated by the coolant pump 105 and the heat exchanger 104 of the second sub cooling system 220.

As another example where the sub cooling systems 210, 220 include more than one deck, for example, an upper deck and a lower deck, if the coolant pump 105 or the heat exchanger 104 for the upper deck of the first sub cooling system 210 stops working due to different reasons, the inlet interconnection valve(s) 2301 and the outlet interconnection valve(s) 2401 for the upper deck are opened to provide the fluid connection between the upper decks of the first sub cooling system 210 and the second sub cooling system 220. This way, the circulation of the liquid coolant on the upper deck of the first sub cooling system 210 is facilitated by the coolant pump 105 and the heat exchanger 104 for the upper deck of the second sub cooling system 220.

As another example where the sub cooling systems 210, 220 include more decks, if the coolant pump 105 or the heat exchanger 104 for a particular deck of the first sub cooling system 210 stops working due to different reasons, the inlet interconnection valve(s) 2301 and the outlet interconnection valve(s) 2401 for the particular deck are opened to provide the fluid connection between the particular deck of the first sub cooling system 210 and the corresponding deck of the second sub cooling system 220. This way, the circulation of the liquid coolant on this particular deck of the first sub cooling system 210 is facilitated by the coolant pump 105 and the heat exchanger 104 for the corresponding deck of the second sub cooling system 220.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is meant to provide the broadest scope, consistent with the principles and the novel and inventive features disclosed or suggested herein. Accordingly, the disclosure is anticipated to hold on to all other such alternatives, modifications, and variations that fall within the scope of the present disclosure and appended claims.

In the claims which follow and in the preceding description of the invention, except where the context requires otherwise due to express language or necessary implication, the word "comprise" or variations such as "comprises" or "comprising" are used in an inclusive sense, i.e. to specify the presence of the stated features but not to preclude the presence or addition of further features in various embodiments of the invention.

Any one of the terms: including or which includes or that includes as used herein is also an open term that also means including at least the elements/features that follow the term, but not excluding others. Thus, including is synonymous with and means comprising.

CROSS-REFERENCE TO RELATED APPLICATION

The entirety of the priority application of this patent application, Australian provisional patent application No. 2021901373, filed on 7 May 2021, is incorporated herein by reference.

The invention claimed is:

1. A cooling system for cooling servers operating in a data centre, the cooling system comprising:
multiple cooling tanks, each of the cooling tanks being configured to accommodate a liquid coolant and sized to immerse the servers in the liquid coolant in order for the liquid coolant to absorb heat generated from the servers so as to cool the servers;
a set of connection pipes configured to fluidly connect the multiple cooling tanks to keep the liquid coolant in each of the multiple cooling tanks at a substantially same level;
a set of inlet pipes, the set of inlet pipes being fluidly connected to the multiple cooling tanks to supply the liquid coolant into the multiple cooling tanks;
a set of outlet pipes, the set of outlet pipes being fluidly connected to the multiple cooling tanks to release the liquid coolant carrying the heat absorbed from the servers out of the multiple cooling tanks;
a heat exchanger that fluidly connects to each of the set of inlet pipes to supply the liquid coolant into the set of inlet pipes and fluidly connects to each of the set of outlet pipes to receive from the set of outlet pipes the liquid coolant carrying the heat absorbed from the servers, the heat exchanger being configured to dissipate the heat from the liquid coolant carrying the heat; and
a coolant pump that fluidly connects to each of the set of outlet pipes, the coolant pump being configured to facilitate circulation of the liquid coolant in the multiple cooling tanks, the set of inlet pipes, the set of outlet pipes, and the heat exchanger.

2. The cooling system of claim 1, wherein the set of inlet pipes comprises a main inlet pipe and multiple branch inlet pipes extending from and fluidly connecting to the main inlet pipe, the main inlet pipe fluidly connects to the heat exchanger and each of the multiple branch inlet pipes fluidly connects to one of the multiple cooling tanks.

3. The cooling system of claim 2, wherein the set of outlet pipes comprises a main outlet pipe and multiple branch outlet pipes extending from and fluidly connecting to the main outlet pipe, the main outlet pipe fluidly connects to the heat exchanger via the coolant pump and each of the multiple branch outlet pipes fluidly connects to one of the multiple cooling tanks.

4. The cooling system of claim 3, wherein each of the connection pipes includes an connection isolation valve to control fluid connection between two adjacent cooling tanks.

5. The cooling system of claim 3, wherein each of multiple branch inlet pipes comprises a balance valve to control a speed at which the liquid coolant flows into the cooling tank to which the branch inlet pipe is fluidly connected.

6. The cooling system of claim 3, wherein each of multiple branch outlet pipes comprises an outlet isolation valve to stop the liquid coolant carrying the heat flow out of the cooling tank to which the branch outlet pipe is fluidly connected.

7. The cooling system of claim 3, further comprises a drain and fill system, the drain and fill system comprising:
   a drain and fill pump;
   a coolant reservoir; and
   a set of drain and fill pipes comprising a main drain and fill pipe and multiple branch drain and fill pipes extending from the main drain and fill pipe and fluidly connected to one of the cooling tanks;
   wherein the main drain and fill pipe is fluidly connected to the drain and fill pump, and the drain and fill pump is fluidly connected to the coolant reservoir.

8. The cooling system of claim 7, wherein each of the branch drain and fill pipes includes a drain and fill valve.

9. The cooling system of claim 7, wherein the set of drain and fill pipes further comprises
   a drain interconnection pipe fluidly connecting the main drain and fill pipe to the main outlet pipe, the drain interconnection pipe including a drain interconnection valve to control fluid connection between the main drain and fill pipe and the main outlet pipe; and
   a fill interconnection pipe fluidly connecting the main drain and fill pipe to the main outlet pipe, the fill interconnection pipe including a fill interconnection valve to control the fluid connection between the main drain and fill pipe and the main outlet pipe;
   such that the liquid coolant can be drained into the main outlet pipe from one or more of the multiple cooling tanks and the liquid coolant can be filled into the one or more of the multiple cooling tanks from the main outlet pipe.

10. The cooling system of claim 9, further comprising:
    a water supply pipe fluidly connected to the heat exchanger to supply water into the heat exchanger in order for the heat exchanger to dissipate the heat into the water:
    a water release pipe fluidly connected to the heat exchanger to release from the heat exchanger the water with the heat;
    a cooling tower that is fluidly connected to the water supply pipe and the water release pipe, the cooling tower being configured to supply the water into the water supply pipe, receive from the water release pipe the water with heat, and release the heat from the water so as to cool down the water before supplying the water into the water supply pipe; and
    a water pump that is fluidly connected to the cooling tower and the water supply pipe to facilitate circulation of the water in the water supply pipe, the water release pipe, the cooling tower, and the heat exchanger.

11. The cooling system of claim 10, wherein the heat exchanger comprises:
    a set of coolant channels fluidly connected to the main outlet pipe to receive from the main outlet pipe the liquid coolant carrying the heat absorbed from the servers and fluidly connected to the main inlet pipe to supply the liquid coolant into the main inlet pipe;
    a set of water channels fluidly connected to the water supply pipe and the water release pipe, the set of water channels being configured to be fluidly isolated from the set of coolant channels but thermally coupled to the set of coolant channels in order for the heat to be dissipated from the liquid coolant to the water.

12. The cooling system of claim 11, wherein the cooling tower comprises a temperature control sensor to set the temperature of the water that is supplied into the water supply pipe.

13. The cooling system of claim 10, wherein the cooling tower comprises an evaporative cooling tower.

14. The cooling system of claim 13, wherein each of the multiple cooling tanks comprises:
    a container forming a working space to accommodate the liquid coolant, wherein the container includes a coolant inlet, a coolant outlet, a first connection conduit, and a second connection conduit, the coolant inlet being configured to fluidly connect to one of the set of inlet pipes, the coolant outlet being configured to fluidly connect to one of the set of outlet pipes, the first connection conduit being configured to fluidly connect to a first connection pipe of the set of connection pipes, the second connection conduit being configured to fluidly connect to a second connection pipe of the set of connection pipes;
    a separation panel extending in the working space of the container to separate the working space into a cooling space and a return space, wherein the cooling space is fluidly coupled to the coolant inlet, the return space is fluidly coupled to the coolant outlet, the first connection conduit, and the second connection conduit, the separation panel being configured such that the liquid coolant in the cooling space flows into the return space due to supply of the liquid coolant into the cooling space via the coolant inlet and the coolant outlet is further configured to release the liquid coolant carrying the heat absorbed from the servers out of the return space.

15. The cooling system of claim 14, wherein the container of each of the multiple cooling tanks comprises:
    a bottom panel having a first edge, a second edge adjacent to the first edge, a third edge adjacent to the second edge and opposite to the first edge, and a fourth edge connecting the third edge with the first edge;
    a first side wall extending from the first edge;
    a second side wall extending from the second edge;
    a third side wall extending from the third edge;
    a fourth side wall extending from the fourth edge,
    wherein the bottom panel, the first side wall, the second side wall, the third side wall, and the fourth side wall form the working space.

16. The cooling system of claim 15, wherein the coolant inlet, the coolant outlet, the first connection conduit, and the second connection conduit are located on the bottom panel.

17. The cooling system of claim 16, wherein the separation panel extends from the bottom panel along the first side wall and the third side wall to separate the working space into the cooling space and the return space such that the first side wall, the third side wall, the fourth side wall, the bottom panel and the separation panel form the cooling space, and the first side wall, the second side wall, the third side wall, the bottom panel and the separation panel form the return space.

18. The cooling system of claim 17, wherein the separation panel has a first height that enables the cooling space to fluidly communicate with the return space above the separation panel such that the liquid coolant in the cooling space is able to flow into the return space.

19. The cooling system of claim 18, wherein the coolant outlet extends from the bottom panel and has a top opening lower than the first height of the separation panel such that the top opening of the coolant outlet is immersed into the liquid coolant carrying the heat absorbed from the servers so as to allow the liquid coolant carrying the heat to flow out of the return space.

20. The cooling system of claim 15, wherein each of the multiple cooling tanks further comprises a coolant distribution panel including multiple holes and extending in the cooling space to cover the coolant inlet so as to evenly distribute the liquid coolant and regulate pressure of the liquid coolant entering the cooling space.

21. The cooling system of claim 20, wherein at least some of the multiple holes of the coolant distribution panel are configured to be aligned with the at least one of the servers.

22. The cooling system of claim 20, wherein the diameter of the multiple holes is 3 millimetres.

23. A cooling system for cooling servers operating in a data centre, the cooling system comprising:
a first sub cooling system of claim 3;
a second sub cooling system of claim 3;
an inlet interconnection pipe fluidly connecting the main inlet pipe of the first sub cooling system with the main inlet pipe of the second sub cooling system to allow the liquid coolant to flow between the main inlet pipe of the first sub cooling system and the main inlet pipe of the second sub cooling system; and
an outlet interconnection pipe fluidly connecting the main outlet pipe of the first sub cooling system with the main outlet pipe of the second sub cooling system to allow the liquid coolant carrying the heat to flow between the main outlet pipe of the first sub cooling system and the main outlet pipe of the second sub cooling system.

24. The cooling system of claim 23, wherein the inlet interconnection pipe includes an inlet interconnection valve that controls a speed the liquid coolant flows between the main inlet pipe of the first sub cooling system and the main inlet pipe of the second sub cooling system.

25. The cooling system of claim 24, wherein the outlet interconnection pipe includes an outlet interconnection valve to control a speed the liquid coolant carrying the heat flows between the main outlet pipe of the first sub cooling system and the main outlet pipe of the second sub cooling system.

26. A cooling tank for cooling servers operating in a data centre, the cooling tank comprises:
a container forming a working space to accommodate a liquid coolant, wherein the container includes a coolant inlet, a coolant outlet, a first connection conduit, and a second connection conduit, the coolant inlet being configured to fluidly connect to one of a set of inlet pipes, the coolant outlet being configured to fluidly connect to one of a set of outlet pipes, the first connection conduit being configured to fluidly connect to a first connection pipe of a set of connection pipes, the second connection conduit being configured to fluidly connect to a second connection pipe of the set of connection pipes;
a separation panel extending in the working space of the container to separate the working space into a cooling space and a return space, wherein the cooling space is fluidly coupled to the coolant inlet, the return space is fluidly coupled to the coolant outlet, the first connection conduit, and the second connection conduit, the separation panel being configured such that the liquid coolant in the cooling space flows into the return space due to supply of the liquid coolant into the cooling space via the coolant inlet and the coolant outlet is further configured to release the liquid coolant carrying the heat absorbed from the servers flows out of the return.

27. The cooling tank of claim 26, wherein the container comprises:
a bottom panel having a first edge, a second edge adjacent to the first edge, a third edge adjacent to the second edge and opposite to the first edge, and a fourth edge connecting the third edge with the first edge;
a first side wall extending from the first edge;
a second side wall extending from the second edge;
a third side wall extending from the third edge;
a fourth side wall extending from the fourth edge,
wherein the bottom panel, the first side wall, the second side wall, the third side wall, and the fourth side wall form the working space.

28. The cooling tank of claim 27, wherein the coolant inlet, the coolant outlet, the first connection conduit, and the second connection conduit are located on the bottom panel.

29. The cooling tank of claim 28, wherein the separation panel extends from the bottom panel along the first side wall and the third side wall to separate the working space into the cooling space and the return space such that the first side wall, the third side wall, the fourth side wall, the bottom panel and the separation panel form the cooling space, and the first side wall, the second side wall, the third side wall, the bottom panel and the separation panel form the return space.

30. The cooling tank of claim 29, wherein the separation panel has a first height that enables the cooling space to fluidly communicate with the return space above the separation panel such that the liquid coolant in the cooling space is able to flow into the return space.

31. The cooling tank of claim 30, wherein the coolant outlet extends from the bottom panel and has a top opening lower than the first height of the separation panel such that the top opening of the coolant outlet is immersed into the liquid coolant carrying the heat absorbed from the servers so as to allow the liquid coolant carrying the heat to flow out of the return space.

32. The cooling tank of claim 26, further comprising a coolant distribution panel including multiple holes and extending in the cooling space to cover the coolant inlet so as to regulate pressure of the liquid coolant entering the cooling space.

33. The cooling tank of claim 32, wherein at least some of the multiple holes of the coolant distribution panel are configured to be aligned with the at least one of the servers.

34. The cooling tank of claim 32, wherein the diameter of the multiple holes is 3 millimetres.

* * * * *